US009123610B2

(12) United States Patent
Hashimoto et al.

(10) Patent No.: US 9,123,610 B2
(45) Date of Patent: Sep. 1, 2015

(54) ARRANGEMENT OF CIRCUITS IN PIXELS, EACH CIRCUIT SHARED BY A PLURALITY OF PIXELS, IN IMAGE SENSING APPARATUS

(71) Applicant: CANON KABUSHIKI KAISHA, Tokyo (JP)

(72) Inventors: Seiji Hashimoto, Kanagawa (JP); Junichi Hoshi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/444,965

(22) Filed: Jul. 28, 2014

(65) Prior Publication Data

US 2014/0332669 A1 Nov. 13, 2014

Related U.S. Application Data

(60) Continuation of application No. 14/080,583, filed on Nov. 14, 2013, now Pat. No. 8,836,834, which is a continuation of application No. 13/344,586, filed on Jan. 5, 2012, now Pat. No. 8,614,757, which is a (Continued)

(30) Foreign Application Priority Data

| Apr. 30, 1998 | (JP) | 10-121390 |
| May 20, 1998 | (JP) | 10-138253 |
| Mar. 5, 1999 | (JP) | 11-058437 |

(51) Int. Cl.
*H01L 27/146* (2006.01)
*H04N 5/3745* (2011.01)

(Continued)

(52) U.S. Cl.
CPC .... *H01L 27/14641* (2013.01); *H01L 27/14603* (2013.01); *H01L 27/14609* (2013.01);
(Continued)

(58) Field of Classification Search
CPC . H04N 5/37457; H04N 5/3745; H04N 5/378; H04N 5/355; H04N 9/045; H01L 27/14641
USPC .......... 348/300, 301, 294, 302, 308; 257/292; 250/208.1
See application file for complete search history.

(56) References Cited

U.S. PATENT DOCUMENTS

| 4,477,835 A | 10/1984 | Berger et al. ................. 358/213 |
| 4,636,865 A * | 1/1987 | Imai .............................. 348/307 |

(Continued)

FOREIGN PATENT DOCUMENTS

| CN | 1162888 | 10/1997 |
| EP | 0757476 | 2/1997 |

(Continued)

OTHER PUBLICATIONS

European Communication and Search Report dated Oct. 17, 2008, regarding Application No. 08160427.4-2203.

(Continued)

*Primary Examiner* — Nhan T Tran
(74) *Attorney, Agent, or Firm* — Fitzpatrick, Cella, Harper & Scinto

(57) ABSTRACT

In an image sensing apparatus having a plurality of unit cells, each including a plurality of photoelectric conversion elements and a common circuit shared by the plurality of photoelectric conversion elements, arranged in either one or two dimensions, the plurality of photoelectric conversion elements are arranged at a predetermined interval.

6 Claims, 44 Drawing Sheets

Related U.S. Application Data continuation of application No. 12/686,931, filed on Jan. 13, 2010, now Pat. No. 8,115,844, which is a continuation of application No. 11/184,881, filed on Jul. 20, 2005, now Pat. No. 7,663,680, which is a division of application No. 09/299,874, filed on Apr. 27, 1999, now Pat. No. 6,977,684.

(51) Int. Cl.
*H04N 9/04* (2006.01)
*H04N 3/14* (2006.01)
*H04N 5/355* (2011.01)
*H04N 5/378* (2011.01)

(52) U.S. Cl.
CPC .......... *H01L27/14645* (2013.01); *H04N 3/155* (2013.01); *H04N 5/355* (2013.01); *H04N 5/378* (2013.01); *H04N 5/37457* (2013.01); *H04N 9/045* (2013.01)

(56) References Cited

U.S. PATENT DOCUMENTS

| | | | |
|---|---|---|---|
| 4,768,085 A | 8/1988 | Hashimoto | 358/48 |
| 4,870,495 A | 9/1989 | Kinoshita et al. | 358/213.28 |
| 4,876,601 A | 10/1989 | Hashimoto et al. | 358/213.26 |
| 4,910,597 A | 3/1990 | Harada et al. | 358/213.15 |
| 4,910,599 A | 3/1990 | Hashimoto | 358/213.26 |
| 4,914,519 A | 4/1990 | Hashimoto et al. | 358/213.18 |
| 4,967,067 A | 10/1990 | Hashimoto et al. | 250/208.1 |
| 4,985,758 A | 1/1991 | Hashimoto | 358/44 |
| 5,162,912 A | 11/1992 | Ueno et al. | 358/213.16 |
| 5,220,170 A * | 6/1993 | Cox et al. | 250/370.09 |
| 5,262,850 A | 11/1993 | Hashimoto | 358/500 |
| 5,288,988 A | 2/1994 | Hashimoto et al. | 250/208.1 |
| 5,315,412 A | 5/1994 | Mihara et al. | 358/512 |
| 5,418,387 A | 5/1995 | Nakamura et al. | 257/231 |
| 5,424,529 A | 6/1995 | Hashimoto et al. | 250/208.1 |
| 5,442,396 A | 8/1995 | Nakashiba | 348/322 |
| 5,461,425 A | 10/1995 | Fowler et al. | 348/294 |
| 5,464,984 A | 11/1995 | Cox et al. | 250/370.11 |
| 5,587,814 A | 12/1996 | Mihara et al. | 358/512 |
| 5,721,422 A | 2/1998 | Bird | 250/208.1 |
| 5,955,753 A | 9/1999 | Takahashi | 257/292 |
| 6,021,172 A | 2/2000 | Fossum et al. | 377/60 |
| 6,107,655 A * | 8/2000 | Guidash | 257/292 |
| 6,160,281 A * | 12/2000 | Guidash | 257/292 |
| 6,352,869 B1 * | 3/2002 | Guidash | 257/292 |
| 6,466,266 B1 * | 10/2002 | Guidash et al. | 348/302 |
| 6,476,851 B1 | 11/2002 | Nakamura | 348/65 |
| 6,522,356 B1 | 2/2003 | Watanabe | 348/272 |
| 6,538,693 B1 | 3/2003 | Kozuka | 348/241 |
| 6,657,665 B1 * | 12/2003 | Guidash | 348/308 |
| 2001/0016083 A1 | 8/2001 | Hayashi et al. | 382/312 |

FOREIGN PATENT DOCUMENTS

| | | | |
|---|---|---|---|
| EP | 0845900 | 6/1998 | |
| EP | 0862219 | 9/1998 | ............ H01L 27/146 |
| EP | 0898312 | 2/1999 | ............ H01L 27/146 |
| EP | 0926738 | 6/1999 | |
| JP | 58-85690 | 5/1983 | |
| JP | 60-167580 | 2/1984 | |
| JP | 62-15991 | 1/1987 | |
| JP | 63-100879 | 2/1988 | |
| JP | 64-010665 | 1/1989 | |
| JP | 4-88781 | 3/1992 | |
| JP | 5-122440 | 5/1993 | |
| JP | 5-243543 | 9/1993 | |
| JP | 6-204450 | 7/1994 | |
| JP | 7-030084 | 1/1995 | |
| JP | 9-064324 | 1/1995 | |
| JP | 9-046596 | 2/1997 | |
| JP | 10-032762 | 2/1998 | |
| WO | 97/07631 | 2/1997 | |

OTHER PUBLICATIONS

Holst, Gerald C., "CCD arrays, cameras, and displays," $2^{nd}$ Edition, Apr. 1, 1998, Spie Optical Engineering Press, XP002150346.

Huat A., et al. "A 128 × 128-pixel standard-CMOS image sensor with electronic shutter", vol. 31, No. 12, Dec. 1, 1996, IEEE Journal of Solid-State Circuits, pp. 1922-1930, XP000691811.

Ihara et al., "A 3.7×3.7μm$^2$ Square Pixel CMOS Image Sensor for Digital Still Camera Application", ISSCC98/Session 11/Image Sensors/Paper FA 11.8, IEEE Feb. 1998.

K Aizawa et al., "A Novel Image Sensor for On-Sensor Compression", Journal of Television Society, vol. 50, No. 2, pp. 257-264, 1996.

Office Action regarding corresponding Japanese Patent Application No. 10-138253.

Office Action dated Aug. 29, 2003 in corresponding Chinese Application No. 99105296.X.

Yamawaki, M., et al., "A pixel size shrinkage of amplified MOS imager with two-line mixing", vol. 43, No. 5, May 1, 1996, IEEE Transactions on Electron Devices, p. 713-719, XP000596268.

* cited by examiner

F I G. 21
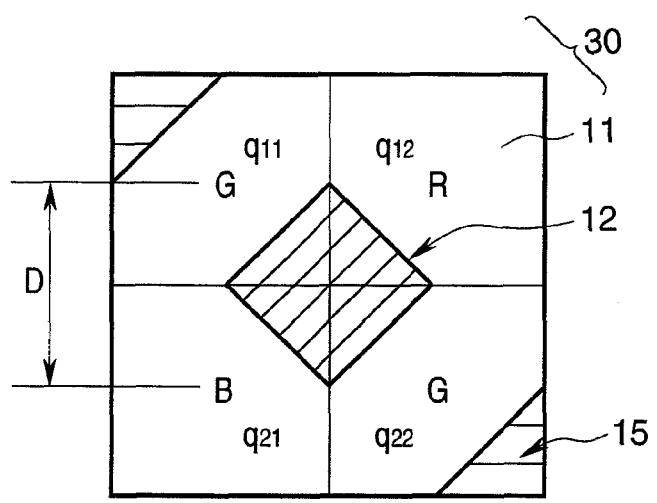

F I G. 24
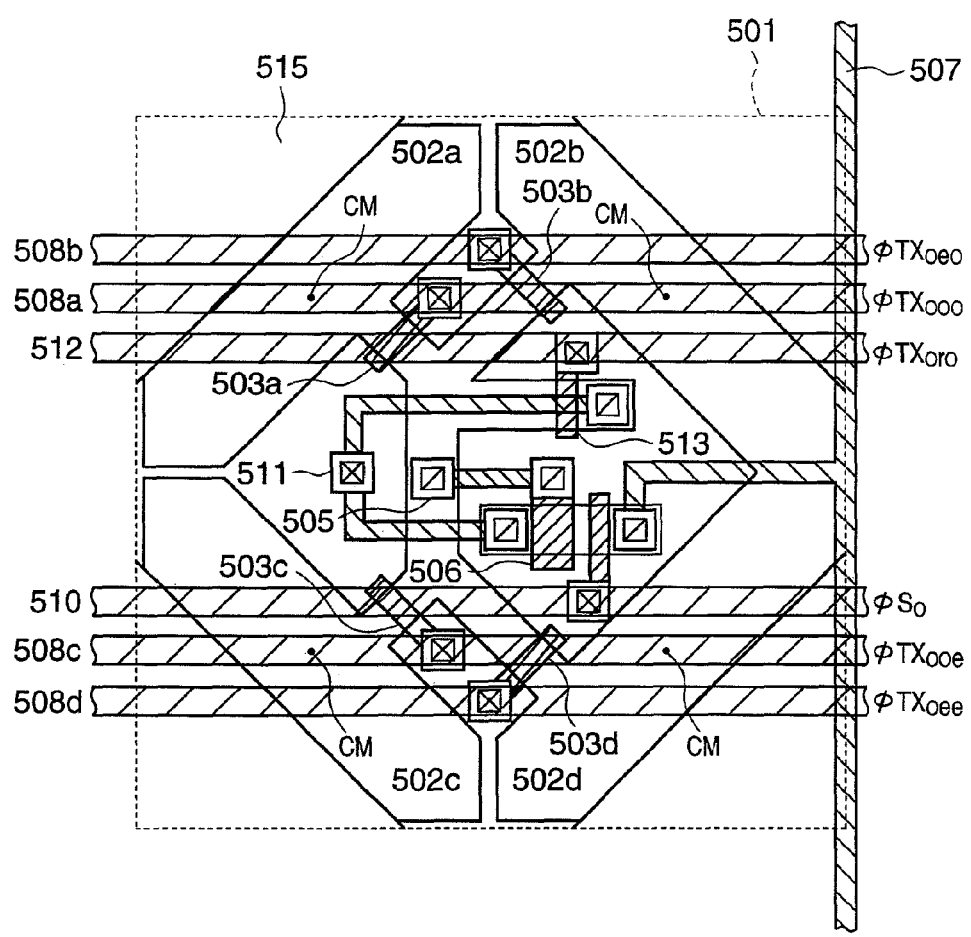

FIG. 45A

| R | G | R | G |
|---|---|---|---|
| G | B | G | B |
| R | G | R | G |

FIG. 45B

| Cy | Ye |
|----|----|
| Mg | G  |
| Cy | Ye |
| G  | Mg |

$a_1 > a > a_2$

ARRANGEMENT OF CIRCUITS IN PIXELS, EACH CIRCUIT SHARED BY A PLURALITY OF PIXELS, IN IMAGE SENSING APPARATUS

This application is a continuation of U.S. application Ser. No. 14/080,583, filed Nov. 14, 2013 (currently pending), which is a continuation of U.S. application Ser. No. 13/344, 586, filed Jan. 5, 2012 (now U.S. Pat. No. 8,614,757), which is a continuation of U.S. application Ser. No. 12/686,931, filed Jan. 13, 2010 (now U.S. Pat. No. 8,115,844), which is a continuation of U.S. application Ser. No. 11/184,881, filed Jul. 20, 2005 (now U.S. Pat. No. 7,663,680, dated Feb. 16, 2010), which is a division of U.S. application Ser. No. 09/299, 874 filed Apr. 27, 1999 (now U.S. Pat. No. 6,977,684, dated Dec. 20, 2005), which are incorporated by reference herein in their entirety, as if fully set forth herein, and claims the benefit of priority under 35 U.S.C. §119, based on Japanese Priority Application Nos. 10-121390, filed on Apr. 30, 1998; 10-138253, filed on May 20, 1998; and 11-058437, filed on Mar. 5, 1999, which are incorporated by reference herein in their entirety, as if fully set forth herein.

BACKGROUND OF THE INVENTION

The present invention relates to an image sensing apparatus in which a plurality of pixels share a common circuit and an image sensing system using the apparatus.

Conventionally, as an image sensing apparatus using a gain cell, or an active pixel sensor (APS), there are image sensing apparatuses utilizing MOS FET, JFET, bipolar transistor.

These image sensing apparatuses amplify photo-charges generated by photodiodes, that are photoelectric conversion elements, by various methods, then output the amplified photo-charge signals as image information. Since an amplifier for amplifying photo-charge exists in each pixel, the pixel is called a gain cell or an APS.

An APS includes an amplifier and its controller in each pixel, therefore, the percentage of an area reserved for the photoelectric conversion element in a pixel (area ratio) or area where light incidents in a pixel (aperture) tends to be small. This may cause deterioration of the dynamic range, sensitivity, and the S/N ratio of an image sensing apparatus.

As described above, when an amplifier is provided in each pixel, as shown in FIG. 40, the aperture decreases. To prevent the decrease in the area or the aperture caused by the amplifier, methods of sharing an amplifier by a plurality of pixels, as disclosed in the Japanese Patent Application Laid-Open Nos. 63-100879 and 9-46596, have been proposed.

FIGS. 41 and 42 illustrate configurations shown in the above documents. Referring to FIGS. 41 and 42, reference PD1 to PD4 denote photodiodes as photoelectric conversion elements; $M_{TX1}$ to $M_{TX4}$ are MOS transistors for transferring photo-charges generated by the photodiodes PD1 to PD4; $M_{RES}$ is a MOS transistor for resetting the MOS transistors $M_{TX1}$ to $M_{TX4}$; and $M_{SF}$ and $M_{SEL}$ are MOS transistors configuring an amplifier (source follower). $M_{SEL}$ also functions as a selection switch for selecting a pixel.

However, in the Japanese Patent Application Laid-Open Nos. 63-100879 and 9-46596, no practical layout of the foregoing elements on a chip when a plurality of pixels share a single amplifier is discussed.

Further, there is no description about a layout in a case where an amplifier, shared by a plurality of pixels, is replaced by another unit.

SUMMARY OF THE INVENTION

The present invention has been made in consideration of the above situation, and has as its first object to provide an image sensing apparatus, in which a common circuit, such as an amplifier, is shared by a plurality of pixels, achieving good performance without deterioration in resolution.

Further, it is the second object of the present invention to provide an image sensing apparatus having a noise reduction system, preferably used in the image sensing apparatus, in which a common circuit is shared by a plurality of pixels.

It is the third object of the present invention to provide an image sensing system using the foregoing image sensing apparatuses as a sensor unit.

According to the present invention, the foregoing first object is attained by providing an image sensing apparatus having a plurality of unit cells, each including a plurality of photoelectric conversion elements and a common circuit shared by the plurality of photoelectric conversion elements, arranged in either one or two dimensions, wherein the plurality of photoelectric conversion elements are arranged at a predetermined interval.

The first object is also attained by providing an image sensing apparatus having a plurality of unit cells, each including a plurality of photoelectric conversion elements and a common circuit shared by the plurality of photoelectric conversion elements, arranged in two dimensions, wherein photoelectric conversion elements, out of the plurality of photoelectric conversion elements, which are covered by a color filter that contributes mostly to forming a luminance signal are arranged in a same interval both in the horizontal and vertical directions by arranging adjoining rows or columns of photoelectric conversion elements shifted from each other.

Further, the first object is also attained by providing an image sensing apparatus having a plurality of unit cells, each including a plurality of photoelectric conversion elements and a common circuit shared by the plurality of photoelectric conversion elements, arranged in either one or two dimensions, characterized by comprising adjustment means for adjusting centers of mass of light-receiving areas of the plurality of photoelectric conversion elements provided in a central portion of the image sensing apparatus, so as to be apart at a same spatial interval.

Furthermore, the first object is also attained by providing an image sensing apparatus having a plurality of unit cells, each including a plurality of photoelectric conversion elements and a common circuit shared by the plurality of photoelectric conversion elements, arranged in either one or two dimensions, characterized by comprising adjustment means for adjusting centers of mass of light-receiving areas of photoelectric conversion elements selected from the plurality of photoelectric conversion elements, provided in a central portion of the image sensing apparatus, on the basis of a predetermined condition, so as to be apart at a same spatial interval.

Further, to achieve the second object of the present invention, noise reading means for reading a noise of the common circuit; first signal reading means for reading a first signal through the common circuit; second signal reading means for reading a second signal through the common circuit; and noise reduction means for reducing the noise from the first and second signals are further provided.

Alternatively, noise reading means for reading a noise of the common circuit; signal reading means for reading a plurality of signals through the common circuit; and noise reduction means for reducing the noise from the plurality of signals are further provided.

Further, the third object of the present invention is achieved by providing an image sensing system having the image sensing apparatus as described above, a lens system for forming an image on the image sensing apparatus, and a signal processing circuit for processing an output signal from the image sensing apparatus.

Other features and advantages of the present invention will be apparent from the following description taken in conjunction with the accompanying drawings, in which like reference characters designate the same or similar parts throughout the FIG. 5*res* thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 21 is another layout of amplifiers in pixels according to the third embodiment of the present invention;

FIG. 24 is another practical pattern layout of four photodiodes and an amplifier according to the third embodiment of the present invention;

FIGS. 45A and 45B shows color filter arrangements;

DETAILED DESCRIPTION OF THE PREFERRED EMBODIMENTS

Preferred embodiments of the present invention will be described in detail below in accordance with the accompanying drawings.

<Possible Arrangements of Pixels and Common Circuit>

First, possible arrangements of a plurality of pixels and a common circuit, shared by the pixels, based on the disclosure of the Japanese Patent Application Laid-Open Nos. 63-100879 and 9-46596, are described below. In the following explanation, an amplifier is used as an example of the common circuit in an image sensing apparatus.

Figure 43:
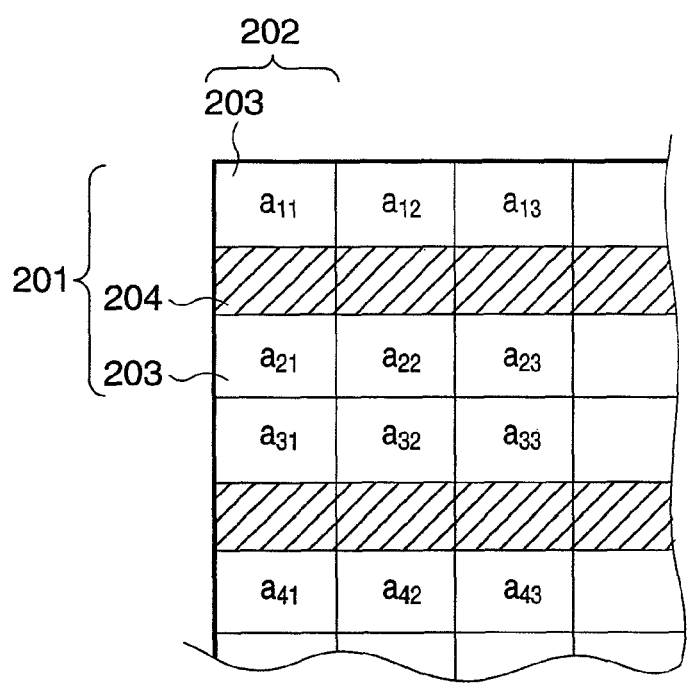
FIG. 43 shows a layout of common circuitry in pixels when each common circuit is shared by two pixels.

FIG. 43 shows an example of a layout of common circuits in pixels, when each common circuit is shared by two pixels. In FIG. 43, a case where each amplifier, as the common circuit, is shared by two pixels in two rows is shown, and, more specifically, each amplifier 204 is arranged between two photodiodes 203 above and below the row of the amplifiers 204 (such as, pairs of photodiodes $a_{11}$ and $a_{21}$, $a_{12}$ and $a_{22}$, $a_{31}$ and $a_{41}$, $a_{32}$ and $a_{42}$, and so on). Note, a photodiode 203, which is a photoelectric conversion element, and one half of the amplifier 204 configure a pixel. Reference numeral 201 indicates a unit cell repeated in the column direction, and reference numeral 202 indicates the unit cell repeated in the row direction.

Figure 44:
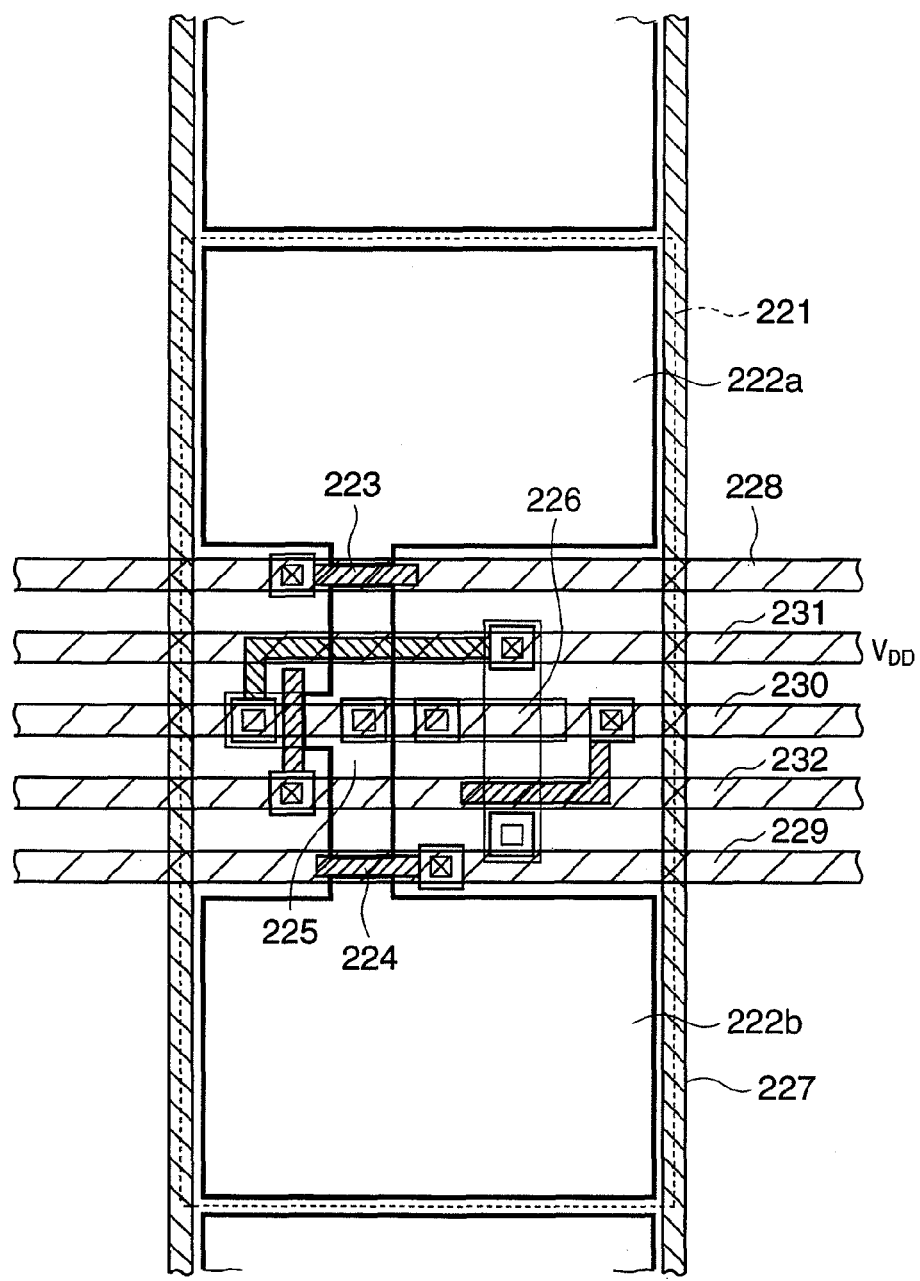
FIG. 44 shows a practical pattern layout of two photodiodes and an amplifier shown in FIG. 43.

FIG. 44 shows a practical pattern layout of two photodiodes and an amplifier (a signal unit cell). The image sensing apparatus is a CMOS sensor, in this case.

Referring to FIG. 44, reference numeral 221 denotes the unit cell (area surrounded by a dash line), which are referred to by reference numerals 201 and 202 in FIG. 43, having a size of two pixels, and repeatedly arranged in both the row and column directions. Light incidents on photodiodes 222a and 222b (areas surrounded by bold lines, correspond to the photodiode pairs $a_{11}$ and $a_{21}$, $a_{12}$ and $a_{22}$, $a_{31}$ and $a_{41}$, $a_{32}$ and $a_{42}$, and so on, shown in FIG. 43) is converted into electrical charges (photo-charges), and accumulated within the photodiodes 222a and 222b. The accumulated photo-charges are respectively transferred to a floating diffusion portion 225 (also surrounded by a bold line) via a transfer gate 223 for an odd row and a transfer gate 224 for an even row, further transferred to the gate (floating gate) 226 of a MOS-type amplifier, which is the amplifier 204. Current flowing through the MOS-type amplifier is modulated, and the output current is taken out from the pixel array via a vertical signal line 227.

X-Y addressing of the two dimensional pixel array, as shown in FIG. 43, in the image sensing apparatus is realized by the vertical signal line 227, an odd-row scanning line 228, an even-row scanning line 229, and a row selection line 230. In addition, a power line 231 for supplying electric power $V_{DD}$ and a reset line 232 for resetting the floating diffusion portion 225 and the gate 226 to a predetermined voltage are also arranged in the horizontal direction.

The lines 228 to 232 are arranged above the wiring of the unit cells, and the lines are basically wide. The area under these five opaque lines 228 to 232 does not receive light, therefore, the amplifier 204 is arranged under the lines 228 to 232. For the above reason, the two photodiodes sharing the amplifier are considered to be arranged on the upper and lower sides of the amplifier.

With this layout, however, since the centers of mass (CM) of the photodiodes are not equal, seen in FIG. 43, the following problems arise.

First, if the pixel array outputs signals of a single color, since spatial frequency and resolution are different in one part from the other, the resolution deteriorates, and moreover, moiré appears.

Figures 45A, 45B:
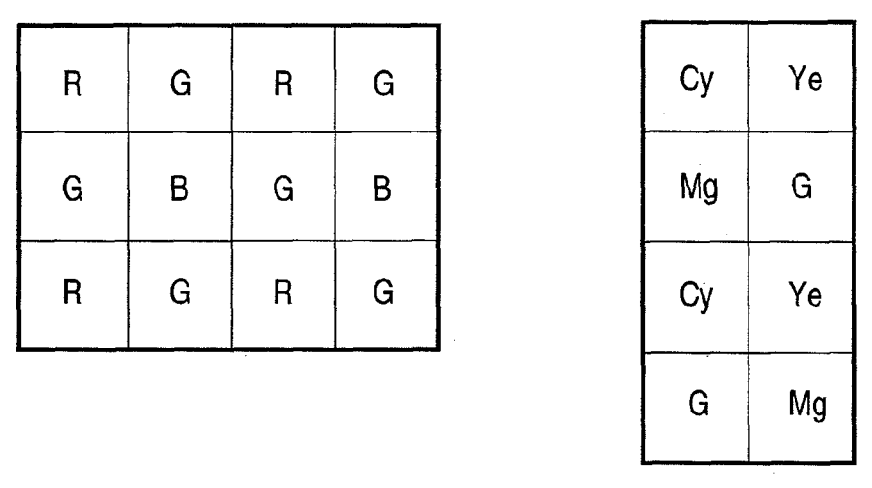

It is possible to cover the pixel array with a color filter whose color arrangement is as shown in FIG. 45A or 45B. In designing the color filter, colors may be arranged so that difference between intervals between pixels corresponding to each color is minimized. In this case, however, the color arrangement is strictly limited.

Further, if the Bayer filter as shown in FIG. 45A is used, intervals between pixels corresponding to green (G) filter, which contributes most to luminance (Y) signals that the human eye is most sensitive to, are not equal. More specifically, considering the positions of the photodiodes, e.g., $a_{12}$, $a_{23}$, and $a_{32}$ corresponding to the green filter, the distance between the photodiodes $a_{12}$ and $a_{23}$ in the column direction is different from the distance between the photodiodes $a_{23}$ and $a_{32}$ in the column direction. Thus, the filter arrangement causes different intervals between pixels corresponding to green filter, resulting in a moiré problem; therefore, the quality of an obtained image is not good.

Figure 46:
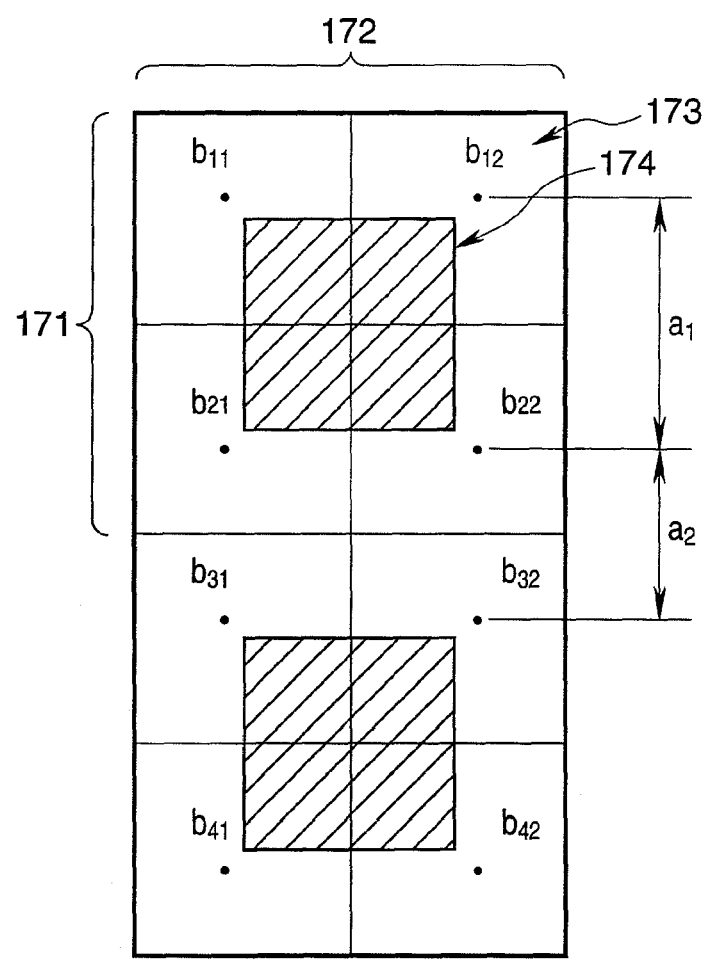
FIG. 46 is a layout of common circuits in pixels when each common circuit is shared by four pixels.

Next, referring to FIG. 46, an example of a layout of common circuits in pixels when each common circuit is shared by four pixels, is explained.

In this case, an amplifier, i.e., the common circuit, is shared by adjoining four pixels in two rows and two columns (2×2), and each amplifier 174 is surrounded by four photodiodes 173 (such as 2×2 photodiodes $b_{11}$, $b_{12}$, $b_{21}$, and $b_{22}$, and $b_{31}$, $b_{32}$, $b_{41}$, and $b_{42}$). In FIG. 46, reference numeral 171 indicates a unit cell repeated in the column direction, and reference numeral 172 indicates the unit cell repeated in the row direction.

Figure 47:
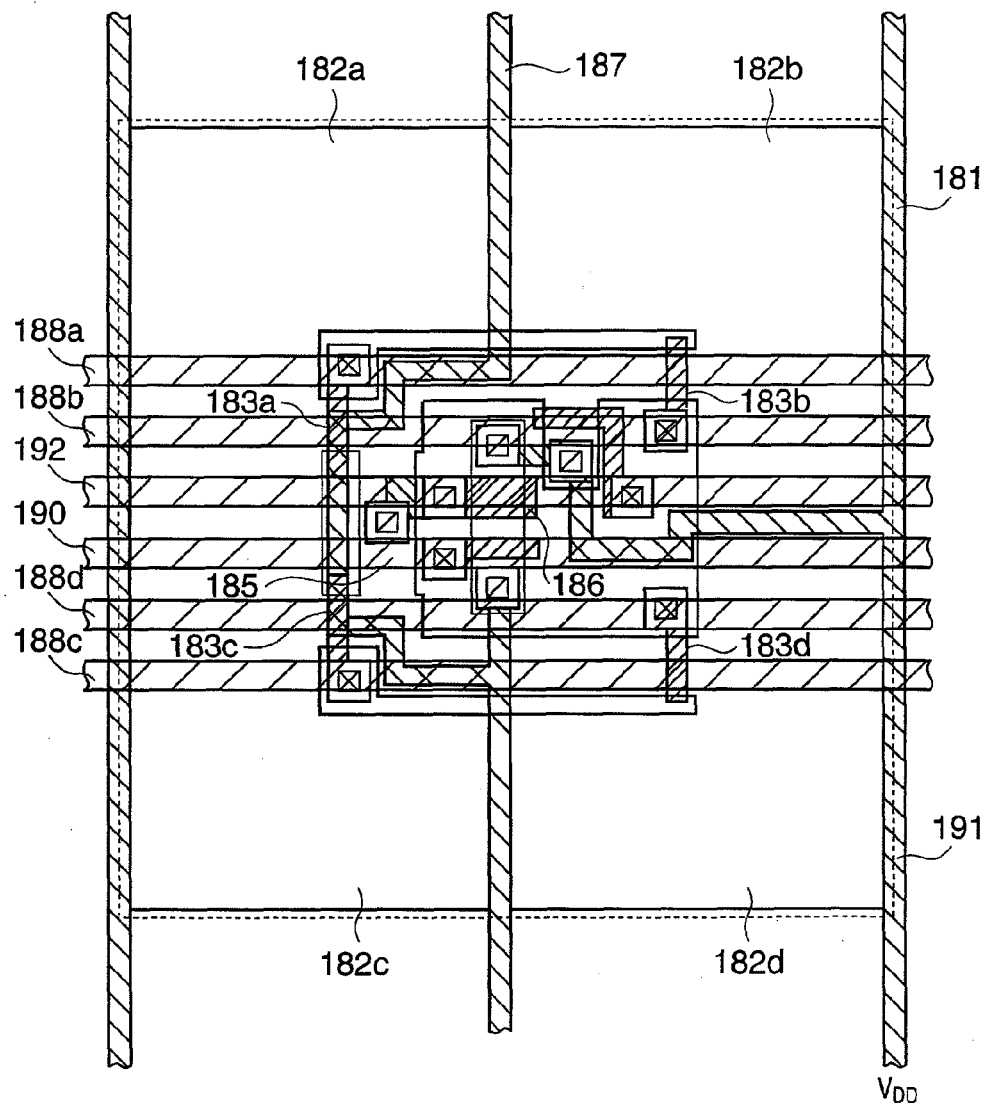
FIG. 47 shows a practical pattern layout of four photodiodes and an amplifier.

FIG. 47 shows a practical pattern layout of four photodiodes and an amplifier. The image sensing apparatus is a CMOS sensor in this case, too.

Referring to FIG. 47, reference numeral 181 denotes the unit cell (area surrounded by a dash line), which is referred to by reference numerals 171 and 172 in FIG. 46, having a size of four pixels, and repeatedly arranged in both the row and column directions. Light incidents on photodiodes 182a to 182d (correspond to either one of groups of the photodiodes, $b_{11}$, $b_{12}$, $b_{21}$, and $b_{22}$, and $b_{31}$, $b_{32}$, $b_{41}$, and $b_{42}$ shown in FIG. 46) is converted into electrical charges (photo-charges), and accumulated within the photodiodes 182a to 182d. The accumulated charges are respectively transferred to a floating diffusion portion 185 via transfer gates 183a to 183d, respectively, further transferred to the gate 186 of MOS-type amplifier, which is the amplifier 174. Current flowing through the MOS-type amplifier is modulated, and the output current is taken out from the pixel array via a vertical signal line 187.

X-Y addressing of the two dimensional pixel array, as shown in FIG. 46, in the image sensing apparatus is realized by the vertical signal line 187, scanning lines 188a to 188d, and a row selection line 190. In addition, a power line 191 for supplying electric power $V_{DD}$ is arranged in the column direction, and a reset line 192 for resetting the floating diffusion portion 185 and the gate 186 to a predetermined voltage are arranged in the horizontal direction.

The lines 188 to 192 are arranged above the wiring of the unit cells, and the lines are basically wide. The area under these six opaque lines 188 to 192 does not receive light, therefore, the amplifier 174 is arranged under the lines 188 to 182. For the above reason, the four photodiodes sharing the amplifier are considered to be arranged around the amplifier.

With this layout, however, since the intervals between the centers of mass (CM) of photodiodes are not equal, as seen in FIG. 46, the following problem arises.

If the pixel array outputs signals of a single color, since spatial frequency and resolution are different in one part from another, the resolution deteriorates, and moreover, moiré appears. The moiré is a serious problem, and an image sensing apparatus with a moiré problem does not sell on the market. This can be said for any image sensing apparatus having a configuration in which any number of pixels share a single common circuit.

Accordingly, the inventors of the present application have developed image sensing apparatuses having improved arrangements of pixels and circuits shared by a plurality of pixels.

The image sensing apparatuses will be described below in detail.

<Basic Configuration of Image Sensing Apparatus>

Figure 1:
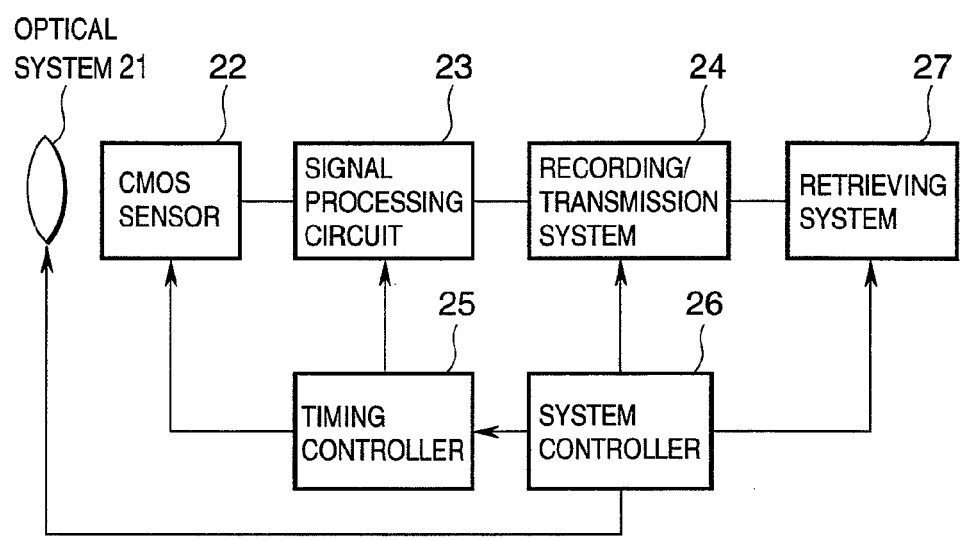
FIG. 1 is a block diagram illustrating a configuration of the image sensing system according to an embodiment of the present invention.

FIG. 1 is a block diagram illustrating a configuration of the image sensing apparatus according to an embodiment of the present invention.

As shown in FIG. 1, light incoming through an optical system 21 forms an optical image on a CMOS sensor 22, and converted into electric charges by a pixel array arranged on the CMOS sensor. The photo-charges are further converted, processed and outputted by a signal processing circuit 23 in a predetermined method. The processed signals are recorded on an information storage medium or outputted by a recording/transmission system 24. The recorded or transmitted information is retrieved by a retrieving system 27. The CMOS sensor 22 and the signal processing circuit 23 are controlled by a timing controller 25, and the optical system 21, the timing controller 25, the recording/transmission system 24, and the retrieving system 27 are controlled by a system controller 26.

Next, the CMOS sensor 22 according to the present invention will be described in detail.

First Embodiment

Figure 2A:
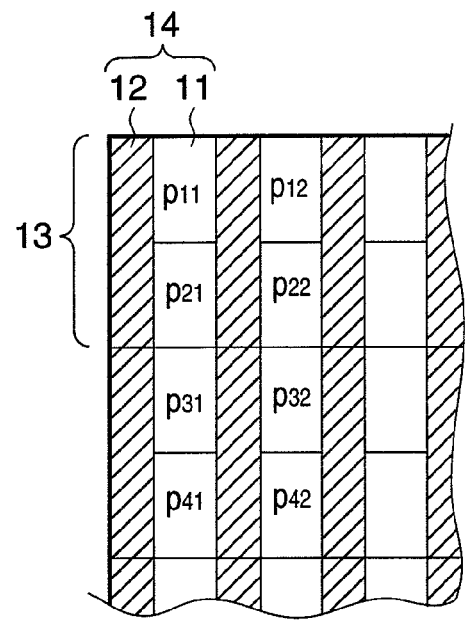
FIG. 2A shows a layout of amplifiers in pixels according to a first embodiment of the present invention.
Figure 2B:
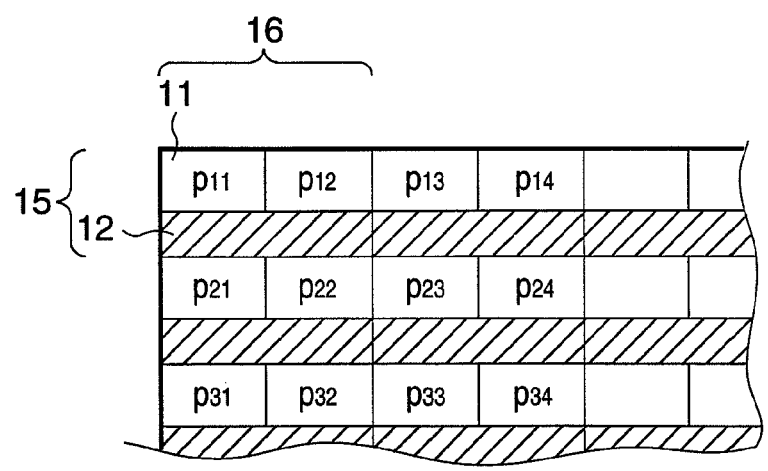
FIG. 2B shows another layout of amplifiers in pixels according to the first embodiment of the present invention.

FIG. 2A shows a layout of amplifiers 12 in pixels when each amplifier 12 is shared by two pixels adjoining in the column direction, and FIG. 2B shows a layout of amplifiers 12 in pixels when each amplifier 12 is shared by two pixels adjoining in the row direction.

In FIG. 2A, two photoelectric conversion elements 11 (such as, pairs of the elements $p_{11}$ and $p_{21}$, $p_{31}$ and $p_{41}$, $p_{12}$ and $p_{22}$, $p_{32}$ and $p_{42}$, and so on) sharing one amplifier 12 are arranged next to each other in the column direction, and the amplifier 12 is arranged along the adjoining pixels. In this manner, intervals between the centers of mass of the photoelectric conversion elements 11 (e.g., $p_{11}$, $p_{21}$, $p_{31}$, $p_{41}$, $p_{12}$, $p_{22}$, $p_{32}$, $p_{42}$) in both the row and column directions become equal. Reference numeral 13 indicates a unit cell repeated in the column direction, and reference numeral 14 indicates the unit cell repeated in the row direction.

Further, in FIG. 2B, two photoelectric conversion elements 11 (such as, pairs of the elements $p_{11}$ and $p_{12}$, $p_{13}$ and $p_{14}$, $p_{21}$ and $p_{22}$, $p_{23}$ and $p_{24}$, $p_{31}$ and $p_{32}$, $p_{33}$ and $p_{34}$, so on) sharing one amplifier 12 are arranged next to each other in the row direction, and the amplifier 12 is arranged along the adjoining pixels. In this manner, intervals between the centers of mass of the photoelectric conversion elements 11 ($p_{11}$, $P_{12}$, $P_{13}$, $p_{14}$, $p_{21}$, $p_{22}$, $p_{23}$, $p_{24}$, $p_{31}$, $p_{32}$, $p_{33}$, $p_{34}$) in both the row and column directions also become equal. Reference numeral 15 indicates a unit cell repeated in the column direction, and reference numeral 16 indicates the unit cell repeated in the row direction.

In the first embodiment, the number, N, of photoelectric conversion elements 11 sharing each amplifier 12 is two (N=2), however, the number N may be an arbitrary number greater than 2.

[Layout 1]

Figure 3:
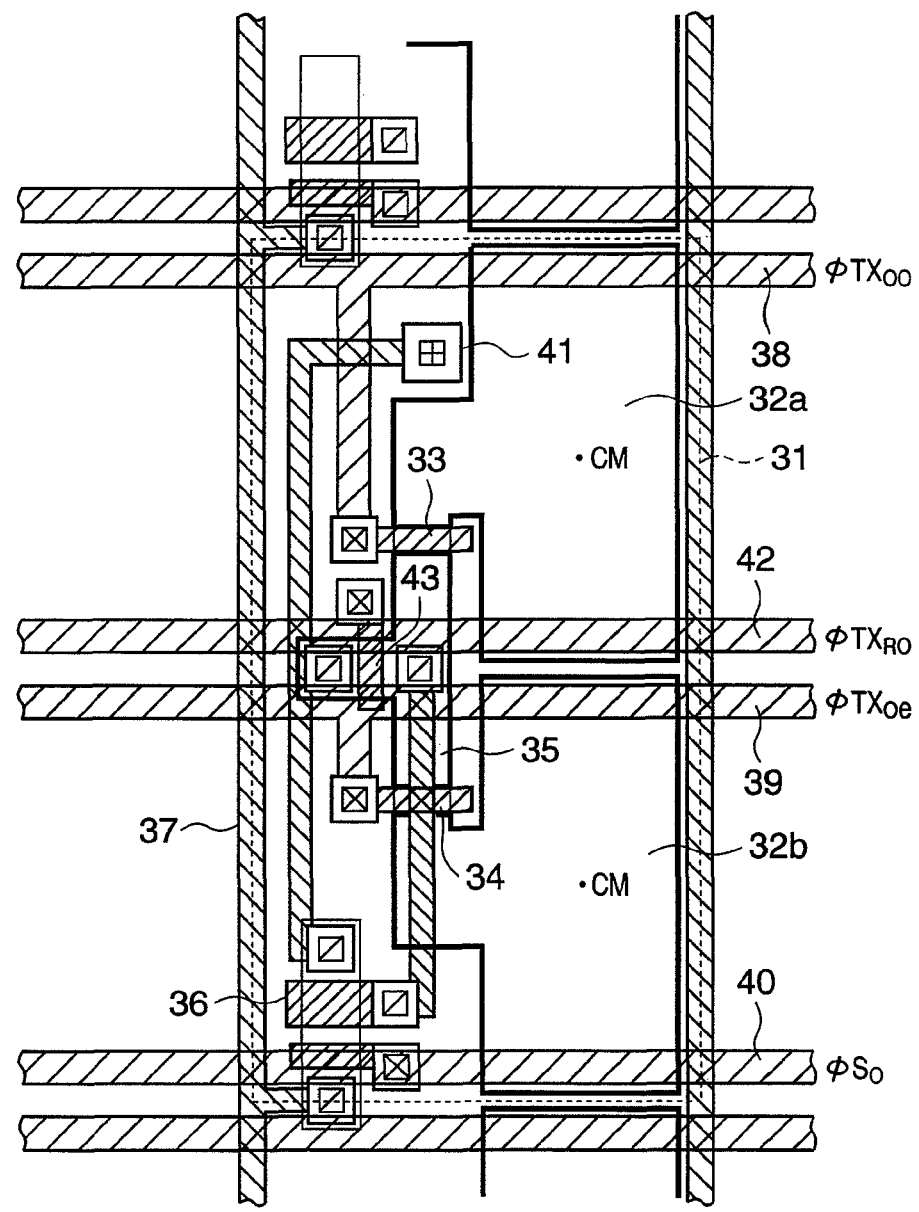
FIG. 3 shows a practical pattern layout of two photodiodes and an amplifier according to the first embodiment of the present invention.
Figure 4:
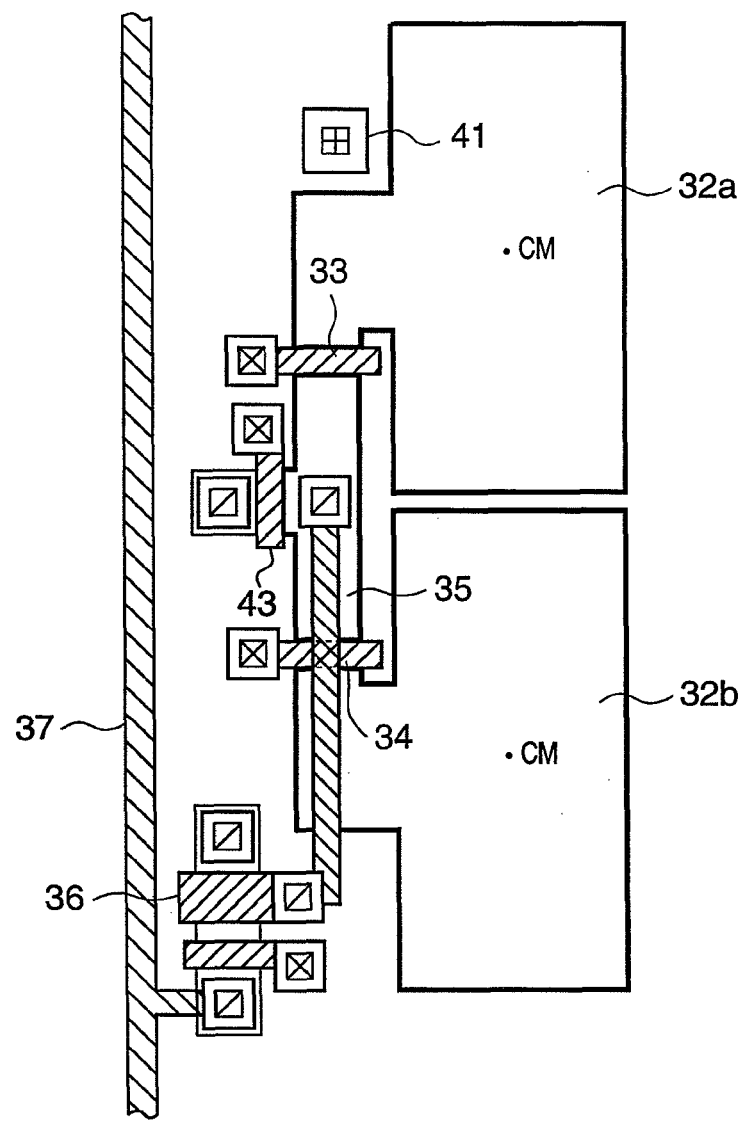
FIG. 4 is a brief view of FIG. 3 from which a part of lines are omitted.

FIG. 3 shows a practical pattern layout of two photodiodes and an amplifier in the CMOS sensor 22, and FIG. 4 is a brief view of FIG. 3 from which a part of lines are omitted.

The CMOS sensor, as shown in FIG. 3, is formed on a single crystalline silicon substrate based on a layout rule 0.4 μm. Each pixel is a square, 8 μm each side, and a source follower amplifier, as the amplifier 12, is shared by two adjoining pixels arranged in the column direction. Therefore, the size of a unit cell 31, shown by a dash line and is referred to by reference numerals 13 and 14 in FIG. 2A, is 8 μm×16 μm. A plurality of unit cells 31 are arranged in two dimensions.

The photodiodes 32a and 32b, i.e., the photoelectric conversion elements, are formed on the right portion of respective pixels, and the shapes of the photodiodes 32a and 32b are almost mirror images. Further, the photodiodes 32a and 32b are designed so that the center of masses (CM) of light-receiving areas of the photodiodes 32a and 32b are located at a substantially identical position of each pixel. In FIG. 3, the areas of the photodiodes 32a and 32b, and the area of a floating diffusion (FD) portion 35 are shown by bold lines. Further, in FIG. 3, reference numeral 38 denotes an odd-row scanning line for controlling each transfer gate 33 in an odd-number row; 39, an even-row scanning line for controlling each transfer gate 34 in an even-number row; 40, a row selection line; and 42, a reset line for controlling the gate 43 of a MOS transistor. In FIG. 4, the lines 38 to 42 are not shown.

Photo-charges accumulated in the photodiodes 32a and 32b are transferred to the FD portion 35 via the transfer gate 33 for the odd-number row and the transfer gate 34 for the even-number row. The size of the both transfer gates 33 and 34 is L=0.4 μm, W=1.0 μm (L is a channel length and W is a channel width). The FD portion 35 is connected to the gate 36 of a source follower via an aluminum (Al) wire having a width of 0.4 μm, and the photo-charge transferred to the FD portion 35 modulates the gate voltage of the gate 36. The size of the MOS transistor of the gate 36 is L=0.8 μm, W=1.0 μm, and the total capacitance of the FD portion 35 and the gate 36 is about 5 fF. Since Q=CV, the gate voltage of the gate 36 changes by 3.2 volts in response to the transference of $10^5$ electrons.

Current flowing in from a $V_{DD}$ terminal 41 is modulated by the MOS transistor of the gate 36, and transferred to a vertical signal line 37. Current flowing through the vertical signal line 37 is processed by a signal processing circuit (not shown) and formed into image information.

Thereafter, in order to set the potentials of the photodiodes 32a and 32b, the FD portion 35, and the gate 36 to the predetermined potential $V_{DD}$, the gate 43 of the MOS transistor connected to the reset line 42 is opened (at this time, the transfer gate 33 for the add-number row and the transfer gate 34 for the even-number row are also opened), thereby the photodiodes 32a and 32b, the FD portion 35, and the gate 36 are electrically connected to the $V_{DD}$ terminal 41.

Thereafter, the transfer gates 35 and 36 are closed, thereby the accumulation of photo-charges in the photodiodes 32a and 32b start again.

The total number of the lines arranged in each unit cell in the horizontal direction is four, specifically, the odd-row scanning line 38, the even-row scanning line 39, the row selection line 40, and the reset line 42. The four lines are arranged in such a manner that two lines each are arranged on the upper and lower ends of each pixel, as shown in FIG. 3.

Since these lines are thick wires and provided over pixels, as described above, an increase in the number of lines results in an increase in area which can not receive light, which reduces aperture. Further, if the number of lines provided over a row is different from the number of lines arranged over another row, such that two lines in one row and three lines in the other row, the apertures and the centers of mass of photodiodes adjoining in the column direction become different in one row from the other.

In layout 1, the power supply voltage $V_{DD}$ is provided to every pixel by connecting a power supply (not shown) with each pixel via a metal light-shield layer (not shown), arranged on the top layer of the CMOS sensor, and the $V_{DD}$ terminal 41, formed as a through hole, in order to avoid the problem described in the previous paragraph.

With the layout 1 as described above, it is possible to provide a CMOS sensor having a plurality of pixels, arranged in the same interval from each other, which have relatively high area ratio or high aperture.

It should be noted that the area ratio or aperture may be further increased by using known on-chip convex lenses, for instance.

Further, the metal layer used for supplying the power supply voltage VDD is not limited to a light-shield film, and may be an electrode material used for forming capacitor, for instance, placed over the entire pixel.

[Layout 2]

Figure 5:
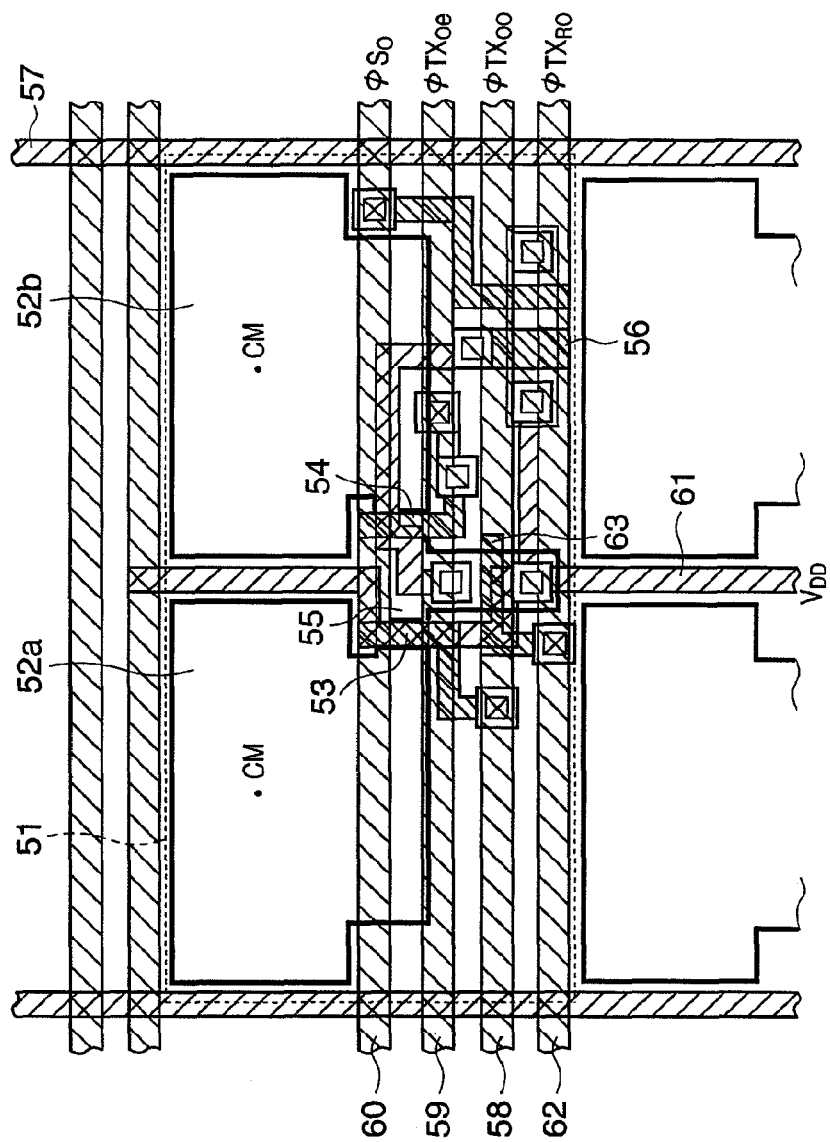
FIG. 5 shows another practical pattern layout of two photodiodes and an amplifier according to the first embodiment of the present invention.
Figure 6:
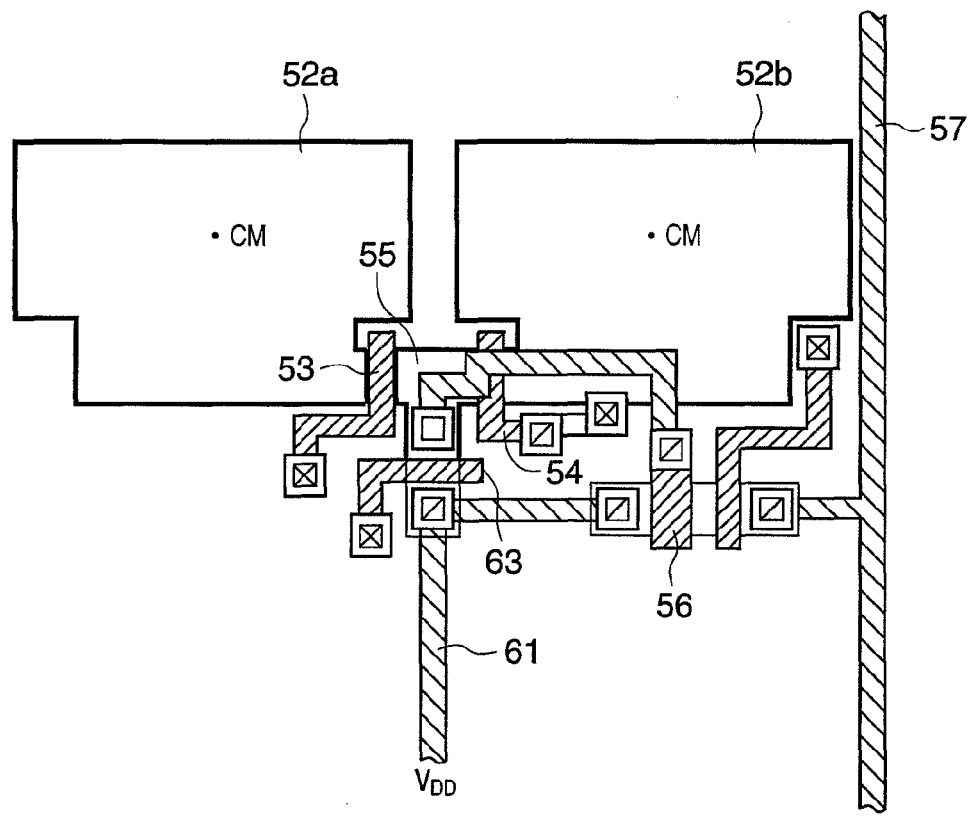
FIG. 6 is a brief view of FIG. 5 from which a part of lines are omitted.
Figure 7:
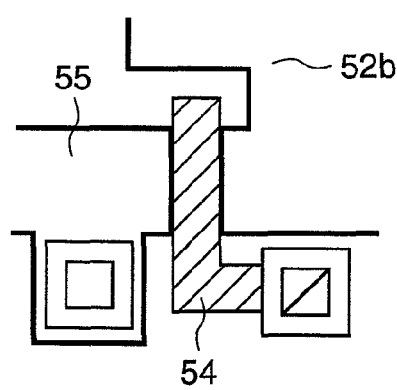
FIG. 7 is an enlarged view showing vicinity of a floating diffusion portion according to the first embodiment of the present invention.
Figure 8:
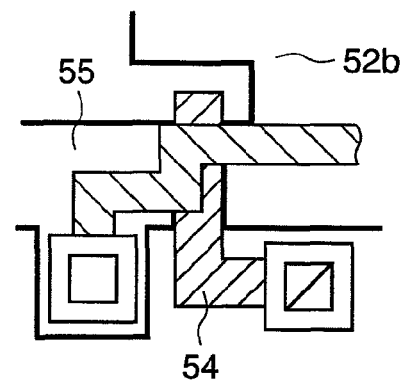
FIG. 8 is an enlarged view showing vicinity of the floating diffusion portion according to the first embodiment of the present invention.

FIG. 5 shows another practical pattern layout of two photodiodes and an amplifier in the CMOS sensor 22, and FIG. 6 is a brief view of FIG. 5 from which several lines are omitted. Further, FIGS. 7 and 8 are enlarged views showing vicinity of an FD portion. Specifically, FIG. 7 is a view when a wire over a gate 54 is omitted, and FIG. 8 is a view when a wire is provided over the gate 54.

Referring to FIGS. 6 to 8, the areas of photodiodes 52a and 52b, and an FD portion 55 are shown by bold lines. The layout 2 also shows a case where two adjoining pixels share a single amplifier, similarly to the layout 1, but the two adjoining pixels are arranged in the row direction. The centers of mass of the two adjoining photodiodes are located at a substantially same position of the each photodiode.

Referring to FIGS. 5 and 6, reference numerals 52a and 52b are the photodiodes; 53, a transfer gate for an odd-number column; 54, a transfer gate for an even-number column; 55, the FD portion; 56, the gate of a source follower; 57, a vertical signal line; 58, an odd-column scanning line for controlling the transfer gate 53 in an odd-number column; 59, an even-column scanning line for controlling the transfer gate 54 in an even-number column; 60, a row selection line; and 62, a reset line for controlling the gate 63 of a MOS transistor. Note, a wire connecting the gate 56 of the source follower and the FD portion 55 crosses over the gate 54 as shown in FIG. 8.

In layout 2, the area ratio or the aperture is improved comparing to the layout 1 in which sharing an amplifier with two pixels adjoining in the column direction. Accordingly, a CMOS sensor of wide dynamic range, high sensitivity, and high S/N ratio is realized.

In layout 2, necessary four lines are arranged, and a power supply line 61 for providing a voltage $V_{DD}$ is arranged in the column direction on the side of photodiodes opposite to the side of the vertical signal line 57.

[Noise Reduction]

The inventors of the present application also have developed a signal read circuit, for reducing noise, suitably used in an image sensing apparatus having a configuration, as described above, in which a plurality of pixels share an amplifier.

The noise reduction operation is explained with reference to FIGS. 9 and 10.

Figure 9:
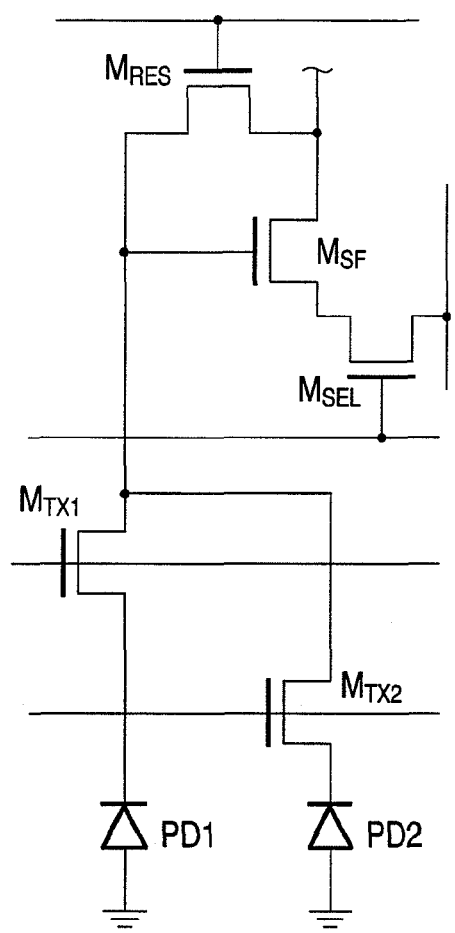
FIG. 9 is a circuit diagram of a unit cell of a CMOS sensor in which two photodiodes share one amplifier according to the first embodiment of the present invention.

FIG. 9 shows a circuit configuration of a unit cell of a CMOS sensor in which two photoelectric conversion elements share one amplifier. Referring to FIG. 9, PD1 and PD2 denote photodiodes as photoelectric conversion elements; $M_{TX1}$ and $M_{TX2}$, MOS transistors for transferring photo-charges accumulated in the photodiodes PD1 and PD2 to an FD portion; $M_{RES}$, a MOS transistor for resetting the FD portion; and $M_{SF}$ and $M_{SEL}$, MOS transistors configuring a source follower. The MOS transistor $M_{SEL}$ also functions as a selection switch for selecting a photodiode.

First, reset operation is performed by turning on the MOS transistor $M_{RES}$, then, noise signal is read out from the MOS transistors $M_{SF}$ and $M_{SEL}$ configuring the source follower. Next, photo-charge accumulated in the photodiode PD1 is transferred to the gate of the MOS transistor $M_{SF}$ via the MOS transistor $M_{TX1}$, then read out as a first signal via the MOS transistors $M_{SF}$ and $M_{SEL}$. Thereafter, reset operation is performed again, and photo-charge accumulated in the photodiode PD2 is transferred to the gate of the MOS transistor $M_{SF}$ via the MOS transistor $M_{TX2}$, then read out as a second signal via the MOS transistors $M_{SF}$ and $M_{SEL}$. Accordingly, the noise signal, the first signal, and the second signal are obtained, and, by subtracting the noise signal from the first and second signals, a signal corresponding to the photodiode PD1 without the noise component as well as a signal corresponding the photodiode PD2 without the noise component are obtained Further, it is possible to add the photo-charge signal corresponding to the photodiode PD1 and the photo-charge signal corresponding to the photodiode PD2 by transferring photo-charge accumulated in the photodiode PD2 to the gate of the MOS transistor $M_{SF}$ while photo-charge accumulated in the photodiode PD1 is kept at the gate of the MOS transistor $M_{SF}$ by changing operation timing.

Next, the image sensing apparatus including a signal processing circuit according to the first embodiment will be explained below. FIG. 10 shows an equivalent circuit of the image sensing apparatus including the signal processing circuit according to the first embodiment, and FIGS. 11 and 12 are timing charts for operating the apparatus.

Figure 10:
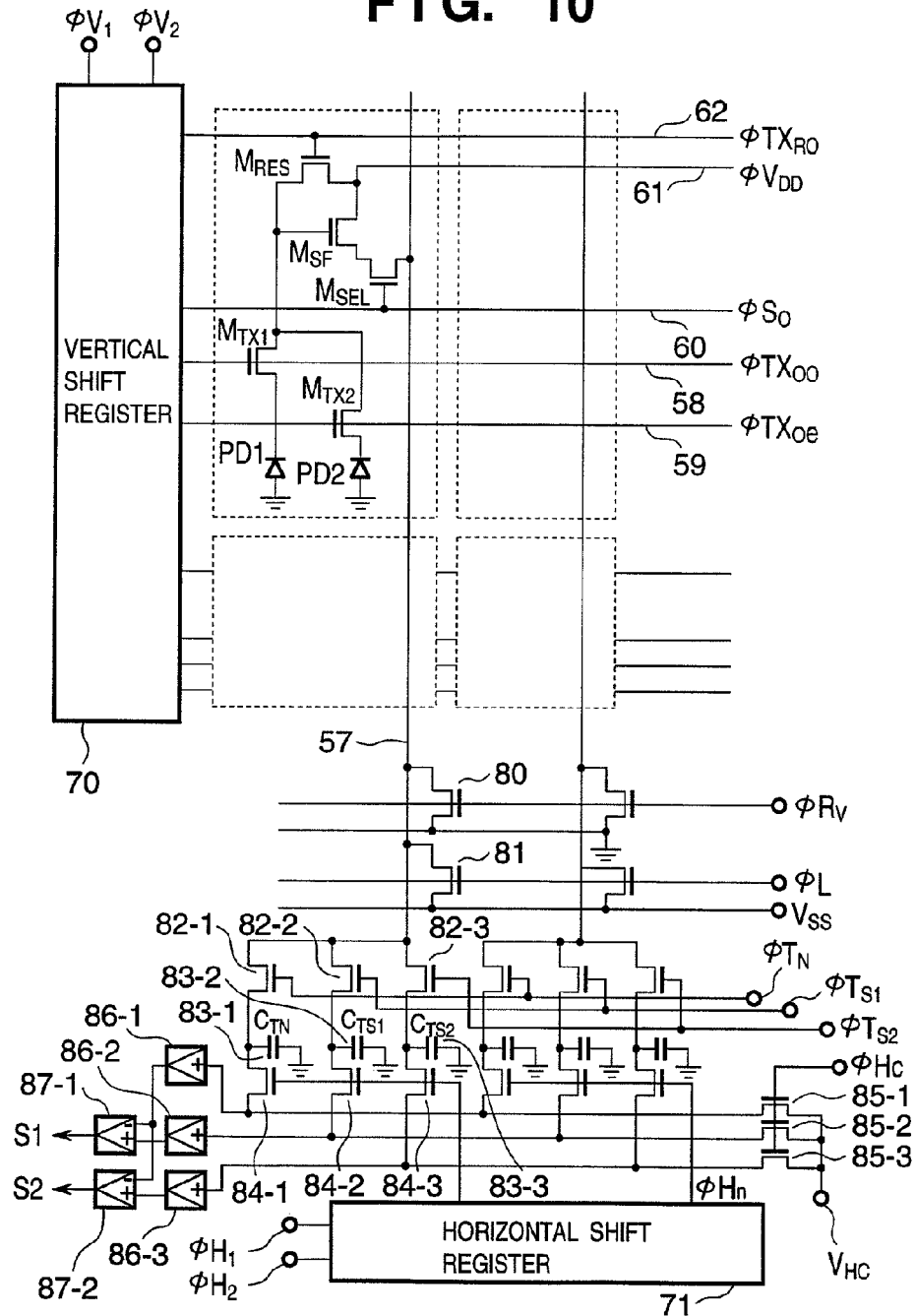
FIG. 10 is a circuit diagram of the image sensing apparatus including a signal processing circuit according to the first embodiment of the present invention.
Figure 11:
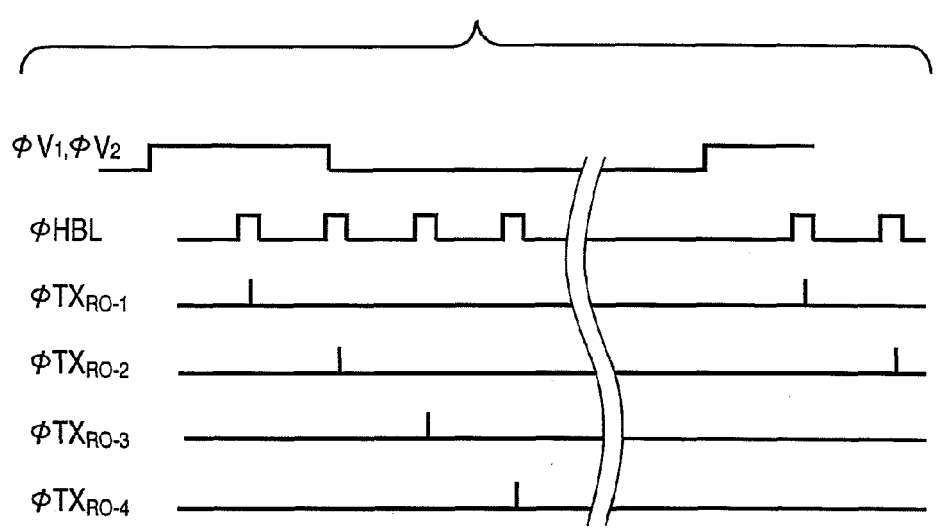
FIG. 11 is a timing chart for operating an image sensing apparatus according to the first and second embodiments of the present invention.
Figure 12:
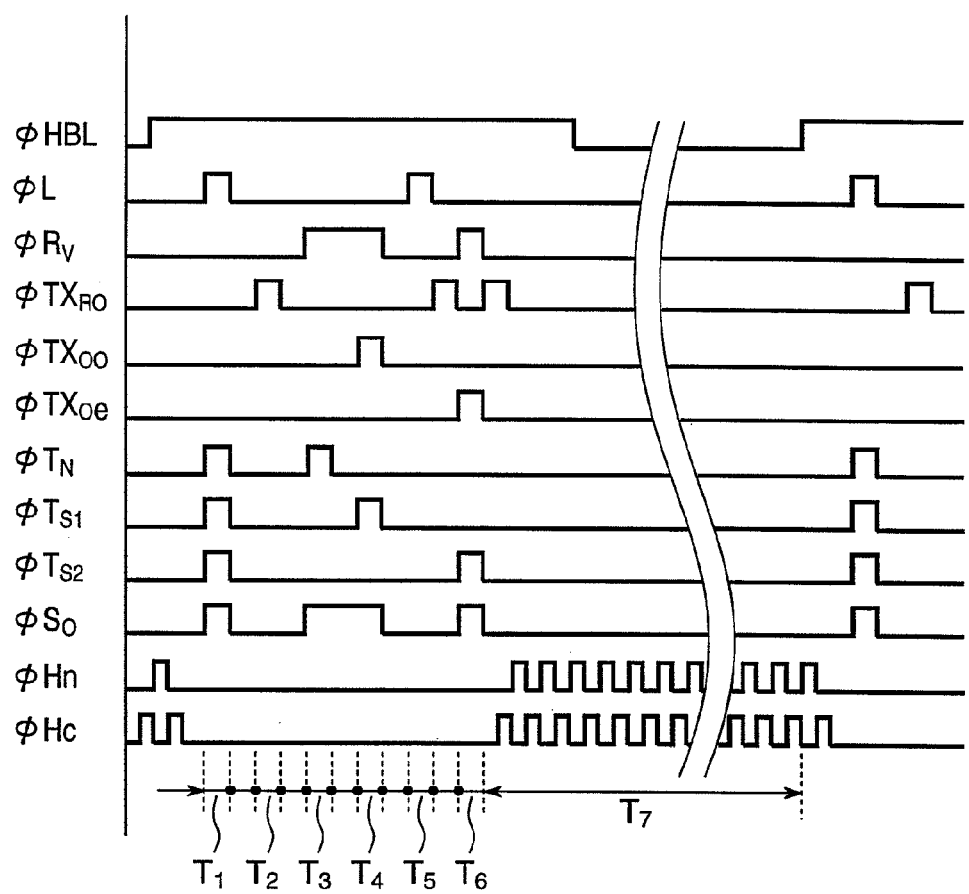
FIG. 12 is a timing chart for operating the apparatus according to the first and second embodiments of the present invention.

Referring to FIGS. 10 and 11, vertical scanning operation is initiated in response to the pulse, which indicates a vertical blanking period, of a signal $\phi V_1$ or $\phi V_2$. First, a signal $\phi TX_{RO-1}$ which is applied to the reset line 62 of the first row is activated during a horizontal blanking period (i.e., when a signal $\phi HBL$ is high), and signals $\phi TX_{RO-i}$ (i is a row number. Below, the last part of the subscript, -i, is omitted.) for subsequent lines are activated in the same manner. Accordingly, all the pixels in every row are reset to the reset potential $V_{DD}$.

In each horizontal blanking period, during a period $T_1$, a signal $\phi L$ becomes high and a transistor 81, connected to the vertical signal line 57, is turned on and the vertical signal line 57 is reset. Simultaneously, signals $\phi T_N$, $\phi T_{S1}$ and $\phi T_{S2}$ also become high, and transistors 82-1, 82-2, and 82-3 are turned on. Accordingly, the upstream part of transistors for reading signals, 84-1, 84-2, and 84-3, and capacitors 83-1, 83-2, and 83-3 ($C_{TN}$, $C_{TS1}$, $C_{TS2}$) are electrically connected to the vertical signal line 57, and reset. Accordingly, residual charges in the capacitors 83-1, 83-2, and 83-3, for instance, are removed.

Thereafter, in a period $T_2$, the signal $\phi TX_{RO}$ to be applied to the reset line 62 is changed to high, and the floating gate, which is the gate of the source follower amplifier configured with the MOS transistors $M_{SF}$ and $M_{SEL}$ in each unit cell, is reset to the voltage $V_{DD}$.

Then, in a period $T_3$, a signal $\phi RV$ becomes high and a transistor 80 for grounding, connected to the vertical signal line 57, is turned on, and the vertical signal line 57 is grounded. Simultaneously, the signal $\phi T_N$ is changed to high in order to connect the capacitor 83-1 ($C_{TN}$) for storing a noise component to the vertical signal line 57, and the transistor 82-1 is turned on. At this time, a signal $\phi S_O$ to be applied to the row selection line 60 is high, and current corresponding to the potential (about $V_{DD}$) at the floating gate of the MOS transistor $M_{SF}$ flows from the $V_{DD}$ terminal 41 to the capacitor 83-1 ($C_{TN}$), thereby the capacitor 83-1 ($C_{TN}$) stores charge corresponding to the noise component.

Next, in a period $T_4$, a signal $\phi TX_{OO}$ applied to the odd-column scanning line 58 is changed to high, in turn, the transfer gate (MOS transistor $M_{TX1}$, in this case) in an odd-number column is turned on, and photo-charge accumulated in the photodiode PD1 is transferred to the floating gate of the MOS transistor $M_{SF}$. The capacitor 83-1 ($C_{TN}$) for storing the noise component is disconnected from the vertical signal line 57 when the signal $\phi T_N$ becomes low, and the capacitor 83-2 ($C_{TS1}$) for storing a photo-charge signal is connected, in turn, when the signal $\phi T_{S1}$ is changed to high. Thus, charge accumulated in the photodiode PD1, for instance, in an odd-number column is stored in the capacitor 83-2 ($C_{TS1}$) via the vertical signal line 57.

Next, in a period $T_5$, the signal $\phi L$ becomes high, and only the vertical signal line 57 is reset. Since the signals $\phi S_O$, $\phi T_N$, $\phi T_{S1}$, and $\phi T_{S2}$, are low, other portions are not reset, and their states are preserved.

Next, the signal $\phi TX_{RO}$ applied to the reset line 62 is changed to high between periods $T_5$ and $T_6$, and the gate of the source follower amplifier (i.e., the gate of MOS transistor $M_{SF}$ is reset to the potential $V_{DD}$.

In the period $T_6$, a signal $\phi TX_{Oe}$ applied to the even-column scanning line 59 is changed to high, and photo-charge accumulated in the photodiode PD2 in an even-number column is transferred to the floating gate of the MOS transistor $M_{SF}$. At this time, the signal $\phi T_{S2}$ is changed to high, thus the capacitor 83-3 ($C_{TS2}$) for storing another photo-charge signal is electrically connected to the vertical signal line 57, and photo-charge accumulated in the photodiode PD2, for: instance, in an even-number column is stored in the capacitor 83-3 ($C_{TS2}$) via the vertical signal line 57.

In the aforesaid manner, charges corresponding to the noise component, a first signal, and a second signal are respectively stored in the capacitors 83-1, 83-2, and 83-3 ($C_{TN}$, $C_{TS1}$, $C_{TS2}$) by each column for a row.

Next, in a period $T_7$, in order to sequentially transfer the charges stored in the capacitors 83-1, 83-2, and 83-3 ($C_{TN}$, $C_{TS1}$, $C_{TS2}$) to amplifiers 86-1 to 86-3, respectively, a horizontal scanning signal $\phi Hn$ is changed to high for each columns controlled by a horizontal shift register 71, and transistors 84-1 to 84-3, provided for each column, are turned on; thereby the capacitors 83-1 to 83-3 ($C_{TN}$, $C_{TS1}$, $C_{TS2}$) are connected to the respective amplifiers 86-1 to 86-3. From the capacitors 83-1 to 83-3 ($C_{TN}$, $C_{TS1}$, $C_{TS2}$), the noise component, the first signal, and the second signal are outputted, and from a differential amplifier 87-1, a signal S1 obtained by subtracting the noise component from the first signal is outputted, and a signal S2 obtained by subtracting the noise component from the second signal is outputted from a differential amplifier 87-2. Note that accumulation of photo-charges in the photodiodes is also performed during the period $T_7$.

In a case where the signal $\phi TX_{RO}$ to be applied to the reset line 62 between the period $T_5$ and the period $T_6$ is not changed to high and reset operation is not performed, photo-charge generated by the photodiode PD2 in an even-number column is transferred to the floating gate of the MOS transistor $M_{SF}$ where photo-charge generated by the photodiode PD1 remains; accordingly, a signal of the photodiode PD1 in the odd-number column and a signal of the photodiode PD2 in the even-number row are stored in the capacitor 83-3 ($C_{TS2}$) via the vertical signal line 57. Therefore, a noise component, a signal corresponding to one photodiode (single signal component), and a signal corresponding to two photodiodes (double signal component) are stored in the capacitors 83-1 to 83-3 ($C_{TN}$, $C_{TS1}$, $C_{TS2}$). Then, the noise component, the single signal component, and the double signal component are outputted to the amplifiers 86-1 to 86-3 during the period $T_7$. Thereafter, the noise component is subtracted from the single signal component by the differential amplifier 87-1 and a signal S1 is outputted. Similarly, the noise component is subtracted from the double signal component by the differential amplifier 87-2 and a signal S2 is outputted.

Further, the first embodiment of the present invention is not limited to two-dimensional array, and capable of applying to an one-dimensional line sensor.

According to the first embodiment as described above, it is possible to realize a high precision image sensor without causing deterioration of performance, such as deterioration of resolution and generation of moiré, for instance. In addition, yield of image sensing apparatus becomes high.

Second Embodiment

Next, the second embodiment of the present invention will be explained.

Figure 13:
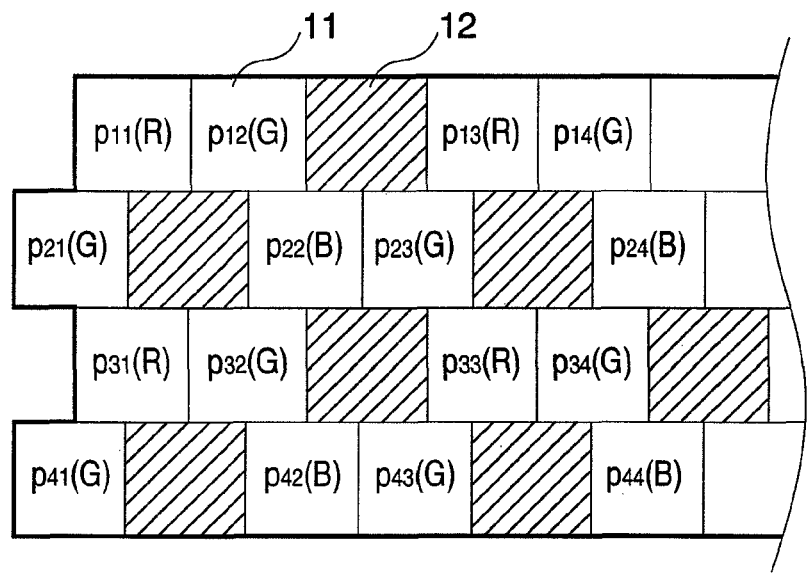
FIG. 13 shows a layout of common circuits in pixels according to the second embodiment of the present invention.
Figure 14:
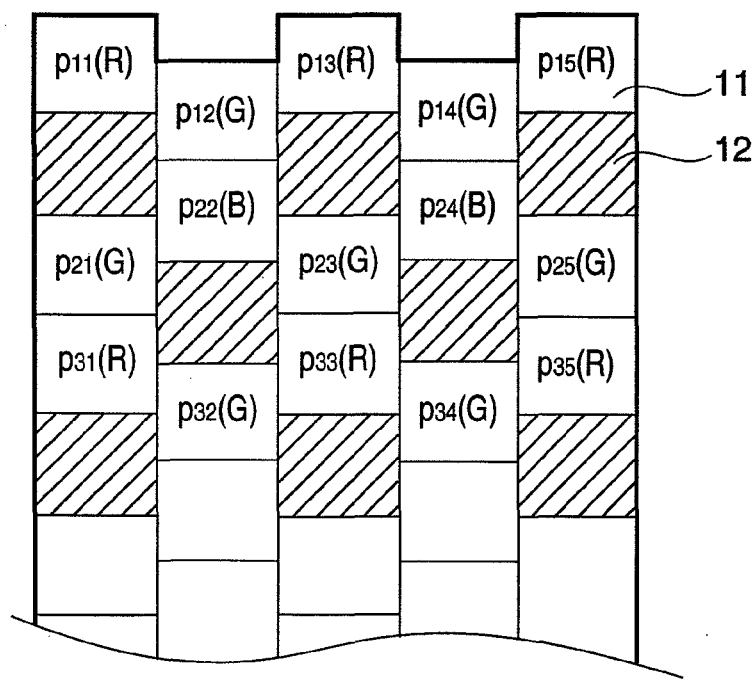
FIG. 14 shows another layout of common circuits in pixels according to the second embodiment of the present invention.

FIGS. 13 and 14 show other layouts of amplifiers 12, as common circuits, and photodiodes 11 when each amplifier 12 is shared by two photodiodes 11.

As shown in FIG. 13, the photodiodes 11 are arranged so that adjoining rows are shifted from each other by one half pitch. In odd-number rows, pixels covered by green (G) filter (referred to as "G pixel" hereinafter), which contribute mainly to a luminance (Y) signal, are respectively set across the amplifiers from pixels covered by red (R) filter (referred to as "R pixel" hereinafter), which contribute to a color-difference signal, and in even-number rows, G pixels are respectively set across the amplifiers from pixels covered by blue (B) filter (referred to as "B pixel" hereinafter), which also contributes to a color-difference signal. By arranging the G pixels in adjoining rows, shifted by one and half pitches in the row direction, intervals between G pixels in the row direction becomes the same, further, intervals between the G pixels in the column direction also become the same. Accordingly problem of moiré is solved, and a sensed image does not look deteriorated.

Further, FIG. 14 shows an example when photodiodes 11 are arranged so that adjoining columns are shifted from each other by one half pitch.

Figure 15:
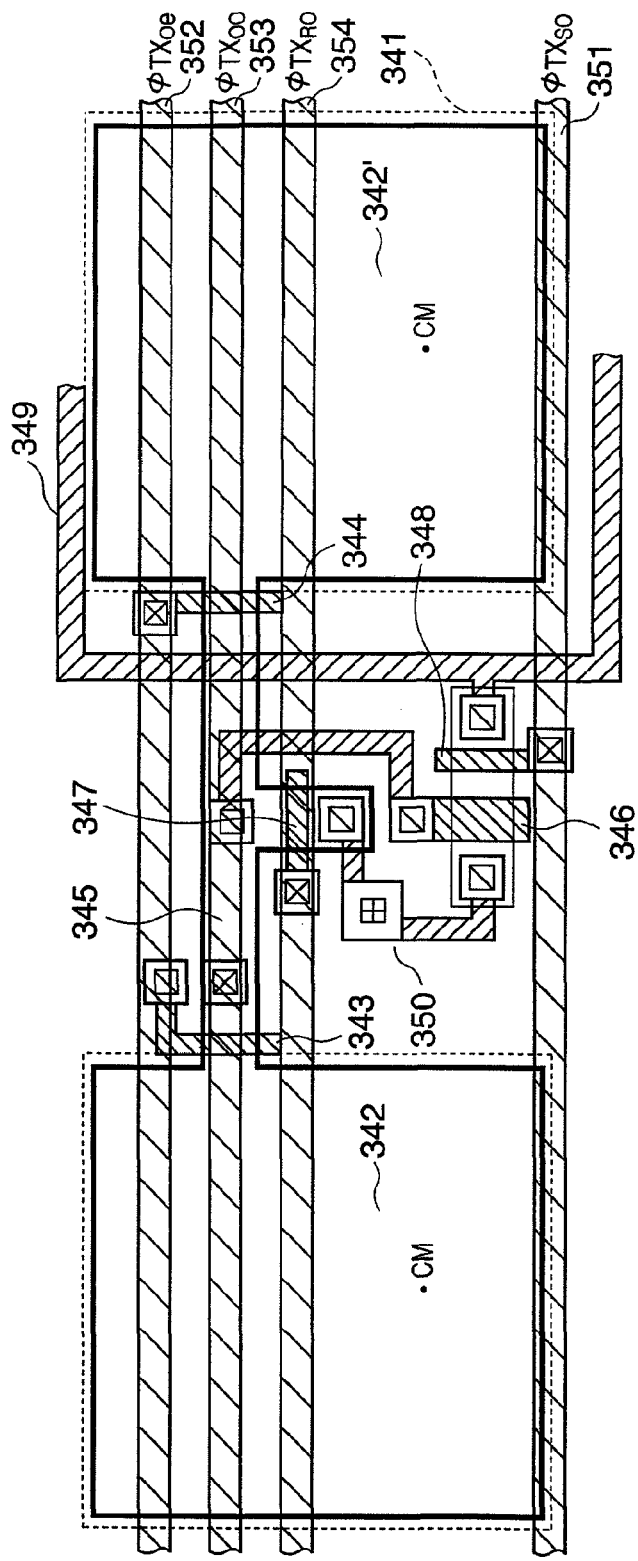
FIG. 15 is a practical pattern layout of the common circuits each shared by two photodiodes according to the second embodiment of the present invention.

Next, FIG. 15 shows a practical pattern layout of two photodiodes and an amplifier, as the common circuit, shared by the two photodiodes 11 arranged on right and left sides of the amplifier 12, as shown in FIG. 13.

The CMOS sensor, as shown in FIG. 15, is formed on a single crystalline silicon substrate. Each pixel is a square, 8 μm each side, shown by a dash line 341. As described above, plural pairs of photodiodes are arranged in a two-dimensional array. Between each pair of two photodiodes, the common circuit is arranged. A photodiode covered by G filter (G photodiode) is set on the left side of the common circuit, and a photodiode covered by R or B filter (R/B photodiode) is set on the right side of the common circuit. In FIG. 15, an amplifier, using MOS transistors, is used as the common circuit, as an example. The layout rule is 0.4 µm, and an area, area ratio, an aperture area, and aperture ratio of a photodiode 342 as a photoelectric conversion element is 57.96 µm², 60.4%, 28.88 µm² and 30.1%, respectively. These figures are very high comparing to conventional figures.

Reference numeral 343 denotes a transfer gate for transferring photo-charge from a G photodiode 342 to a floating diffusion (FD) portion 345 and reference numeral 344 denotes a transfer gate for transferring photo-charge from an R/B photodiodes 342' also to the FD portion 345. The transfer gates 343 and 344 are MOS transistors, and the channel length and the channel width of each MOS transistor is 0.4 µm and 1.0 µm, respectively. Reference numeral 347 denotes a reset gate for resetting the FD portion 345 to a potential of a power supply voltage $V_{DD}$ through a terminal 350, and reference numeral 346 denotes a gate of a MOS-type source follower amplifier. The potential of the gate 346 changes depending upon the transferred charge, and the amplifier modulates current flowing in from the $V_{DD}$ terminal 350.

The total capacitance of the FD portion 345 and the gate 346 is about 10 fF, and as the area of the photodiodes increases, the capacitance also increases. The modulated current is eventually outputted to a vertical signal line 349 via a selection gate 348 for selectively outputting the current.

Further, reference numerals 351 to 354 denote scanning lines for applying a predetermined potential to the selection gate 348, the transfer gates 343 and 344, and the reset gate 347, respectively.

[Noise Reduction]

Next, signal processing for reducing noise preferably used in the above-described image sensor is explained.

Figure 16:
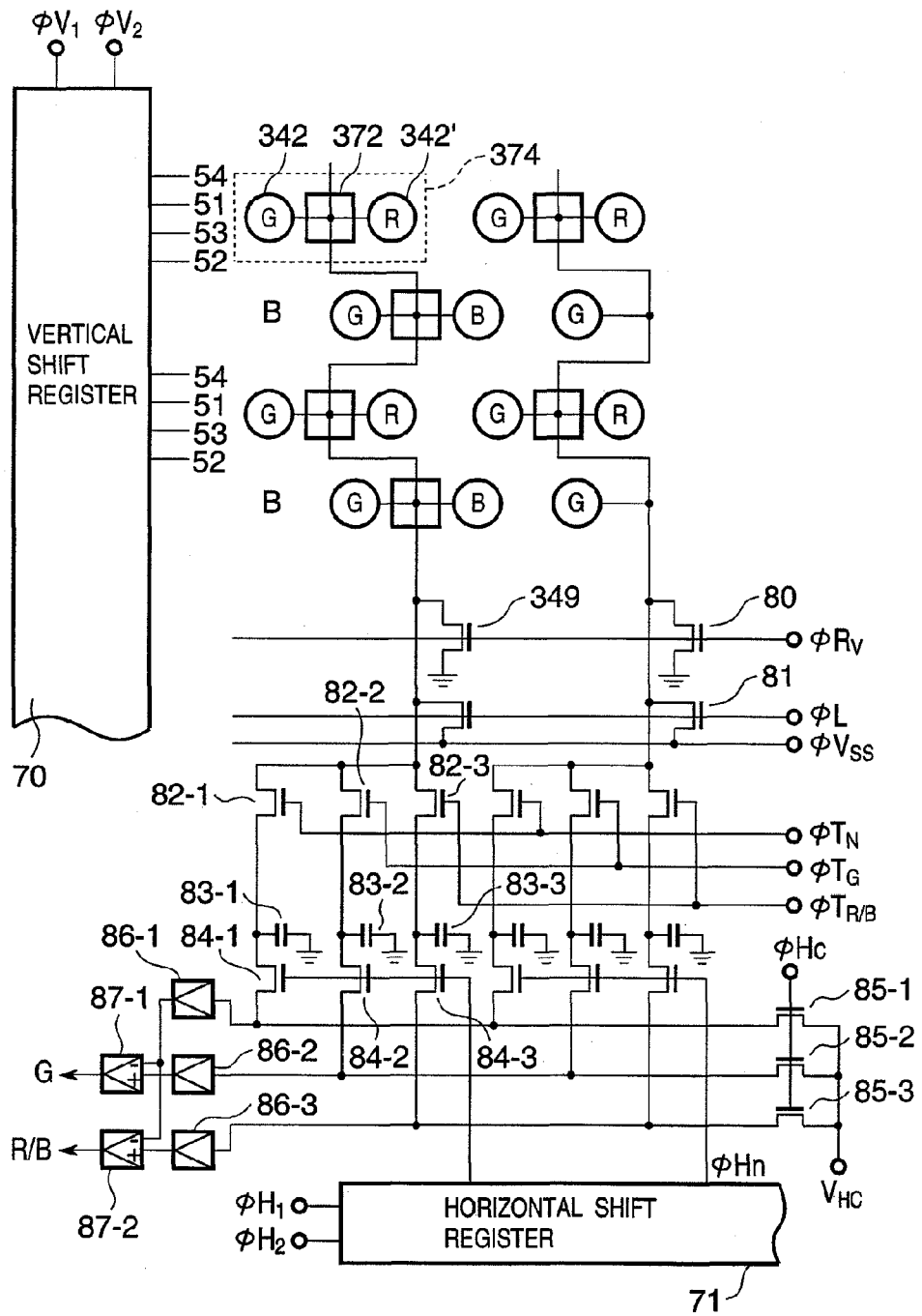
FIG. 16 is a circuit diagram of the image sensing apparatus including a signal processing circuit according to the second embodiment of the present invention.

FIG. 16 is an equivalent circuit diagram according to the second embodiment. In FIG. 16, the same units and elements as those shown in FIGS. 10 and 15 are referred to by the same reference numerals. Further, FIG. 17 is an equivalent circuit diagram of a unit cell 374, surrounded by a dash line in FIG. 16 and whose pattern layout is shown in FIG. 15, configured with a common circuit 372 and photodiodes arranged on the both sides of the common circuit 372.

Figure 17:
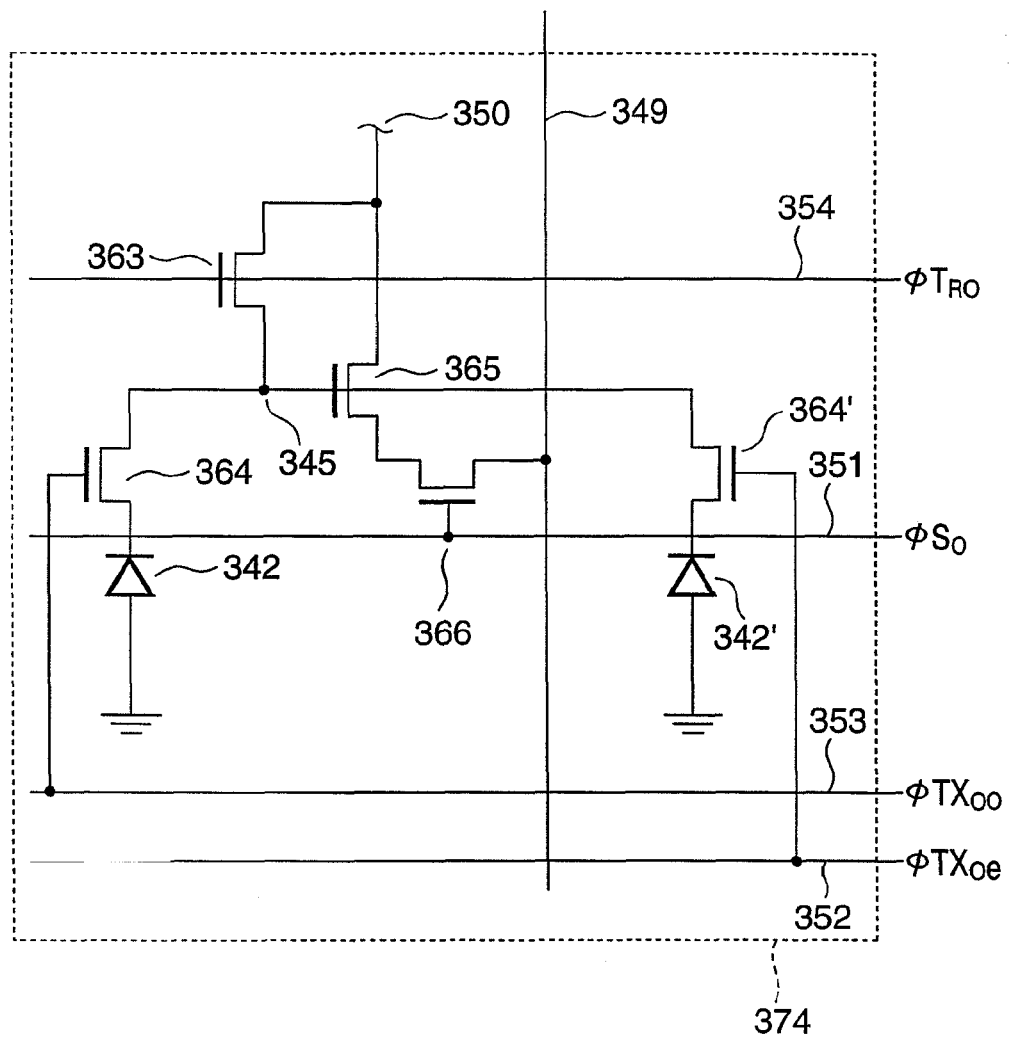
FIG. 17 is a circuit diagram of a unit cell configured with a common circuit and photodiodes according to the second embodiment of the present invention.

In FIG. 17, reference numeral 350 is the $V_{DD}$ terminal; 345, the FD portion; 363, a reset unit, such as a MOS transistor (reset MOS), for resetting the FD portion 345; 364 and 364', transfer units, such as MOS transistors (transfer MOS), for transferring photo-charges from the photodiodes 342 and 342' to the FD portion 345; 365, an amplifier, such as a MOS transistor, for amplifying the change in the potential at the FD portion 345; and 366, a MOS transistor for selection (selection MOS) for selectively outputting a signal from the amplifier 365 to the vertical signal line 349. Further, the scanning lines 354, 351, 352 and 353 are for applying potentials for turning on or off the reset MOS 363, the selection MOS 366, the transfer MOS 364, and the transfer MOS 364', respectively. In the unit cell 374, the MOS transistors 363, 364, 364', 365, and 366 configure the common circuit. Further, in the pattern layout shown in FIG. 15, the transfer gate 343 corresponds to the gate of the transfer MOS 364 of FIG. 17, the transfer gate 344 corresponds to the gate of the transfer MOS 364', the reset gate 347 corresponds to the gate of the reset MOS 363, and the selection gate 348 corresponds to the gate of the selection MOS 366.

Next, referring to the circuit diagrams shown in FIGS. 16 and 17, and timing charts shown in FIGS. 11 and 12, the noise reduction operation is explained.

Referring to FIG. 11, vertical scanning operation is initiated in response to the pulse, which indicates a vertical blanking period, of a signal $\phi V_1$ or $\phi V_2$. First, a signal $\phi TX_{RO-1}$ which is applied to the reset line 354 of the first row is activated during a horizontal blanking period (i.e., when a signal $\phi HBL$ is high), and signals $\phi TX_{RO-i}$ (i is a row number. Below, the last part of the subscript, -i, is omitted.) for subsequent lines are applied in the same manner. Accordingly, all the pixels in every row are reset to the reset potential $V_{DD}$.

In each horizontal blanking period, during a period $T_1$, a signal $\phi L$ becomes high, as shown in FIG. 12, and a transistor 81, connected to the vertical signal line 349, is turned on and the vertical signal line 349 is reset. Simultaneously, signals $\phi T_N$, $\phi T_{S1}$ and $\phi T_{S2}$ also become high, and transistors 82-1, 82-2, and 82-3 are turned on. Accordingly wires in the upstream of transistors for reading signals, 84-1, 84-2, and 84-3, and capacitors 83-1, 83-2, and 83-3, ($C_{TN}$, $C_{TS1}$, $C_{TS2}$) are electrically connected to the vertical signal line 349, and reset. Accordingly, residual charge in the capacitors 83-1, 83-2, and 83-3, for instance, are removed.

Thereafter, in a period $T_2$, the signal $\phi TX_{RO}$ to be applied to the reset line 354 is changed to high, and the floating gate, which is the gate of the source follower amplifier configured with the MOS transistors 365 and 366 in each unit cell is reset to the voltage $V_{DD}$.

Then, in a period $T_3$, a signal $\phi RV$ becomes high and a transistor 80 for grounding, connected to the vertical signal line 349, is turned on, and the vertical signal line 349 is grounded. Simultaneously, the signal $\phi T_N$ is changed to high in order to connect the capacitor 83-1 ($C_{TN}$) for storing a noise component to the vertical signal line 349, and the transistor 82-1 is turned on. At this time, a signal $\phi S_O$ to be applied to the row selection line 351 is high, and current corresponding to the potential (about $V_{DD}$) at the floating gate of the MOS transistor 365 flows from the $V_{DD}$ terminal 350 to the capacitor 83-1 ($C_{TN}$), thereby the capacitor 83-1 ($C_{TN}$) stores charge corresponding to the noise component.

Next, in a period $T_4$, a signal $\phi TX_{OO}$ applied to the G pixel scanning line 353 is changed to high, in turn, transfer gate (MOS transistor 364) for the G pixel is turned on, and photo-charge accumulated in the photodiode 342 is transferred to the floating gate of the MOS transistor 365. The capacitor 83-1 ($C_{TN}$) for storing the noise component is disconnected from the vertical signal line 349 when the signal $\phi T_N$ becomes low, and the capacitor 83-2 ($C_{TS1}$) for storing a photo-charge signal is connected, in turn, when the signal $\phi T_{S1}$ is changed to high. Thus, charge accumulated in the G photodiode 342, for instance, is stored in the capacitor 83-2 ($C_{TS1}$) via the vertical signal line 349.

Next, in a period $T_5$, the signal $\phi L$ becomes high, and only the vertical signal line 349 is reset. Since the signals $\phi S_O$, $\phi T_N$, $\phi T_{S1}$, and $\phi T_{S2}$, are low, other portions are not reset, and their states are preserved.

Next, the signal 100 $TX_{RO}$ applied to the reset line 354 is changed to high between periods $T_5$ and $T_6$, and the FD portion 345 is reset to the potential $V_{DD}$.

In the period $T_6$, a signal $\phi TX_{Oe}$ applied to the R/B pixel scanning line 352 is changed to high, and photo-charge accumulated in the R/B photodiode 342' is transferred to the floating gate of the MOS transistor 365. At this time, the signal $\phi T_{s2}$ is changed to high, thus the capacitor 83-3 ($C_{TS2}$) for storing another photo-charge signal is electrically connected to the vertical signal line 349, and charge accumulated in the R/B photodiodes 342', for instance, is stored in the capacitor 83-3 ($C_{TS2}$) via the vertical signal line 349.

In the aforesaid manner, charges corresponding to the noise component, a first signal, and a second signal are respectively stored in the capacitors 83-1, 83-2, and 83-3 ($C_{TN}$, $C_{TS1}$, $C_{TS2}$) by each column for a row.

Next, in a period $T_7$, in order to sequentially transfer the charges stored in the capacitors 83-1, 83-2, and 83-3 ($C_{TN}$, $C_{TS1}$, $C_{TS2}$) to amplifiers 86-1 to 86-3, respectively, a horizontal scanning signal φHn is changed to high for each columns controlled by a horizontal shift register 71, and transistors 84-1 to 84-3, provided for each column, are turned on; thereby the capacitors 83-1 to 83-3 ($C_{TN}$, $C_{TS1}$, $C_{TS2}$) are connected to the amplifiers 86-1 to 86-3. From the capacitors 83-1 to 83-3 ($C_{TN}$, $C_{TS1}$, $C_{TS2}$), the noise component, the first signal, and the second signal are outputted, and from a differential amplifier 87-1, a G component signal obtained by subtracting the noise component from the first signal is outputted, and an R/B component signal obtained by subtracting the noise component from the second signal is outputted from a differential amplifier 87-2. Note that accumulation of photo-charges in the photodiodes is also performed during the period $T_7$.

In a case where the signal $φTX_{RO}$ to be applied to the reset line 354 between the period $T_5$ and the period $T_6$ is not changed high and reset operation is not performed, photo-charge generated by the R/B photodiodes 342' is transferred to the floating gate of the MOS transistor 365 where photo-charge generated by the G photodiode 342 remains; accordingly, a signal of the G photodiode 342 and a signal of the R/B photodiode 342' are stored in the capacitor 83-3 ($C_{TS2}$) via the vertical signal line 349. Therefore, a noise component, a signal corresponding to one photodiode (single signal component), and a signal corresponding to two photodiodes (double signal component) are stored in the capacitors 83-1 to 83-3 ($C_{TN}$, $C_{TS1}$, $C_{TS2}$). Then, the noise component, the single signal component, and the double signal component are outputted to the amplifiers 86-1 to 86-3 during the period $T_7$. Thereafter, the noise component is subtracted from the single signal component by the differential amplifier 87-1 and a G component signal is outputted. Similarly, the noise component is subtracted from the double signal component by the differential amplifier 87-2 and a G+R/B component signal is outputted.

Figure 18:
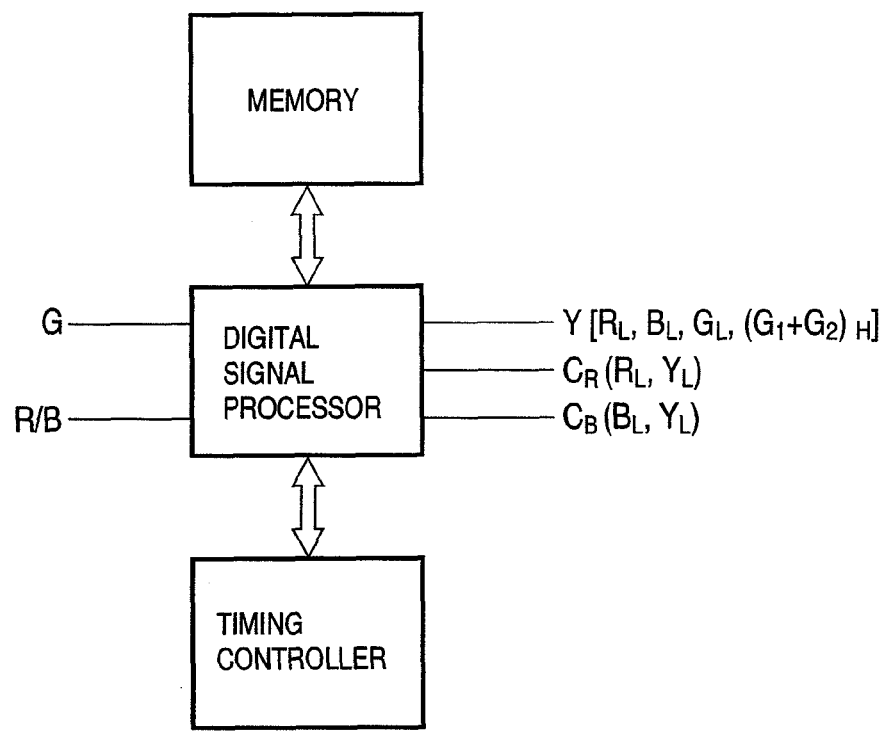
FIG. 18 is an explanatory view for explaining a signal processing circuit.

The signal processing circuit 23, shown in FIG. 1, according to the second embodiment is explained with reference to FIG. 18.

The G and R/B component signals output from the CMOS sensor 22 are converted into luminance (Y) signals and color difference ($C_R$, $C_B$) signals. Note that low frequency component of the luminance signals are generated using R, G, and B signals of at least two adjoining rows.

Further, high frequency component of the luminance signals are generated using high frequency component of G signals in at least two adjoining rows. Accordingly, an image of high resolution and good color reproduction is obtained.

According to the second embodiment as described above, it is possible to obtain an image sensing apparatus of good sensitivity, high resolution, and wide dynamic range.

Third Embodiment

Next, the third embodiment of the present invention will be explained with reference to accompanying drawings.

Figure 19:
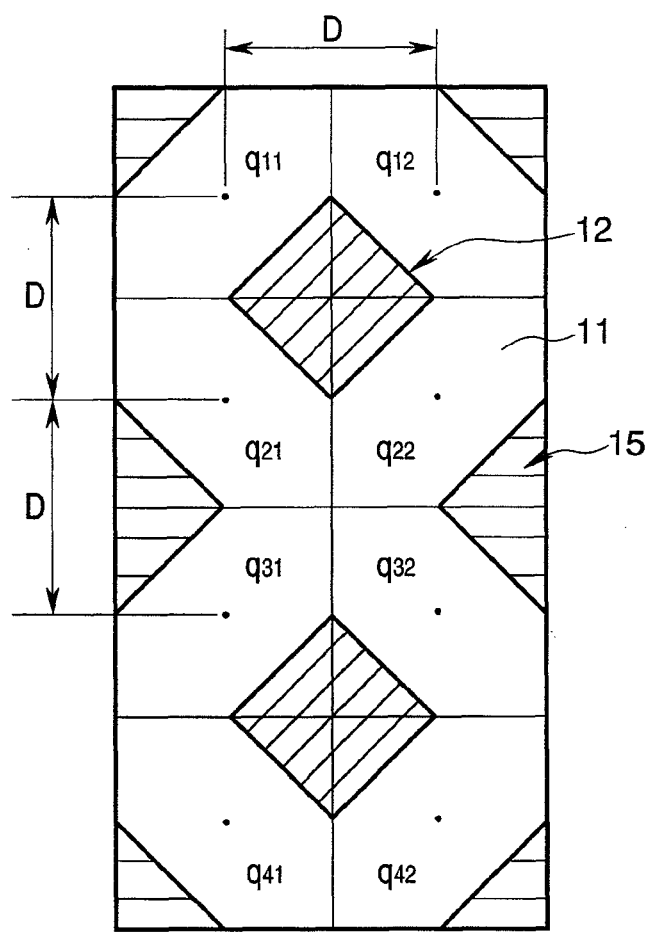
FIG. 19 is a layout of amplifiers in pixels according to a third embodiment of the present invention.

FIG. 19 shows a layout of amplifiers 12 in pixels when each amplifier 12 is shared by four (2 rows×2 columns) pixels, according to the third embodiment.

In FIG. 19, each amplifier 12 is arranged in the center of four pixels, and four photoelectric conversion elements 11 (e.g., $q_{11}$, $q_{12}$, $q_{21}$, $q_{22}$) are arranged as they surround the amplifier 12.

Further, a light-shield unit 17 is provided for each pixel in an area which is symmetry to a portion of the amplifier 12 occupying the pixel with respect to the center of the pixel. Therefore, the center of mass of each photoelectric conversion element 11 is in the center of each pixel. Accordingly, the centers of mass of the photoelectric conversion elements 11 ($q_{11}$, $q_{12}$, $q_{21}$, $q_{22}$, $q_{31}$, $q_{32}$, $q_{41}$, $q_{42}$) are arranged at a same interval, D, both in the row and column directions.

Figure 20:
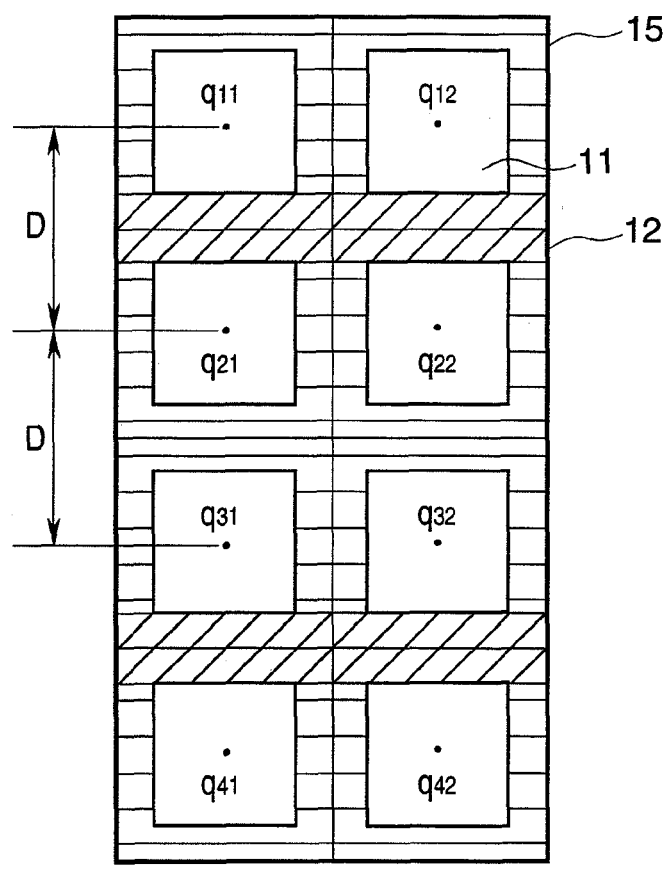
FIG. 20 is another layout of amplifiers in pixels according to the third embodiment of the present invention.

FIG. 20 shows another layout of amplifiers 12 in pixels when each amplifier 12 is arranged at the boundary of four pixels arranged in a 2×2 array in the row direction, and the four photoelectric conversion elements 11 (e.g., $q_{11}$, $q_{12}$, $q_{21}$, $q_{22}$) are arranged so as to sandwich each amplifier 12.

In addition, light-shield unit 17 is arranged in three peripheral areas, other than the peripheral area where the amplifier 12 occupies, of the pixel, as shown in FIG. 20. Therefore, the centers of mass of the photoelectric conversion elements 11 ($q_{11}$, $q_{12}$, $q_{21}$, $q_{22}$, $q_{31}$, $q_{32}$, $q_{41}$, $q_{42}$) are located at the same interval, D, both in the row and column directions.

The arrangement as shown in FIG. 20 is rotated by 90 degrees, namely, an arrangement in which row direction and column direction are exchanged, is also possible.

Further, in an arrangement as shown in FIG. 21, G filter, which contributes most to resolution, is arranged in the upper left pixel and the lower right pixel among four pixels configuring a unit cell 30. In the pixel covered by green filter (G pixel), a light-shield unit 17 is provided in an area which is symmetry to a portion of the amplifier 12, arranged at a central portion of the unit cell 30, occupying the pixel with respect to the center of the pixel. Therefore, the center of mass of the photoelectric conversion element 11 of the G pixel is at the center of the G pixel. With this configuration, intervals, D, of the photoelectric conversion elements q11 and q12 of G pixels become the same both in the row and column directions.

Further, a pixel covered by red filter (R pixel) is arranged in the upper right pixel in the unit cell 30, and a pixel covered by blue filter (B pixel) is arranged in the lower left pixel in the unit cell 30. These pixels do not have light-shield units, differing from the G pixels; however, since a single R pixel and a single B pixel are arranged in each unit cell 30, the intervals between adjacent R and B pixels become identical, namely 2D.

Figure 22:
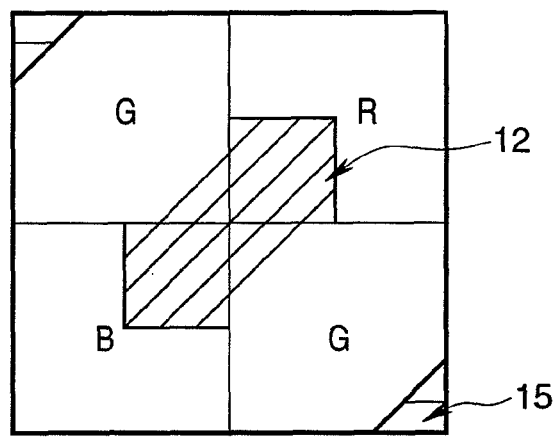
FIG. 22 is another layout of amplifiers in pixels according to the third embodiment of the present invention.

FIG. 22 is another layout of amplifiers 12 in pixels. In this layout, areas occupied by the amplifier 12 and the light-shield units 17 are reduced in the G pixels.

[Layout 1]

Figure 23:
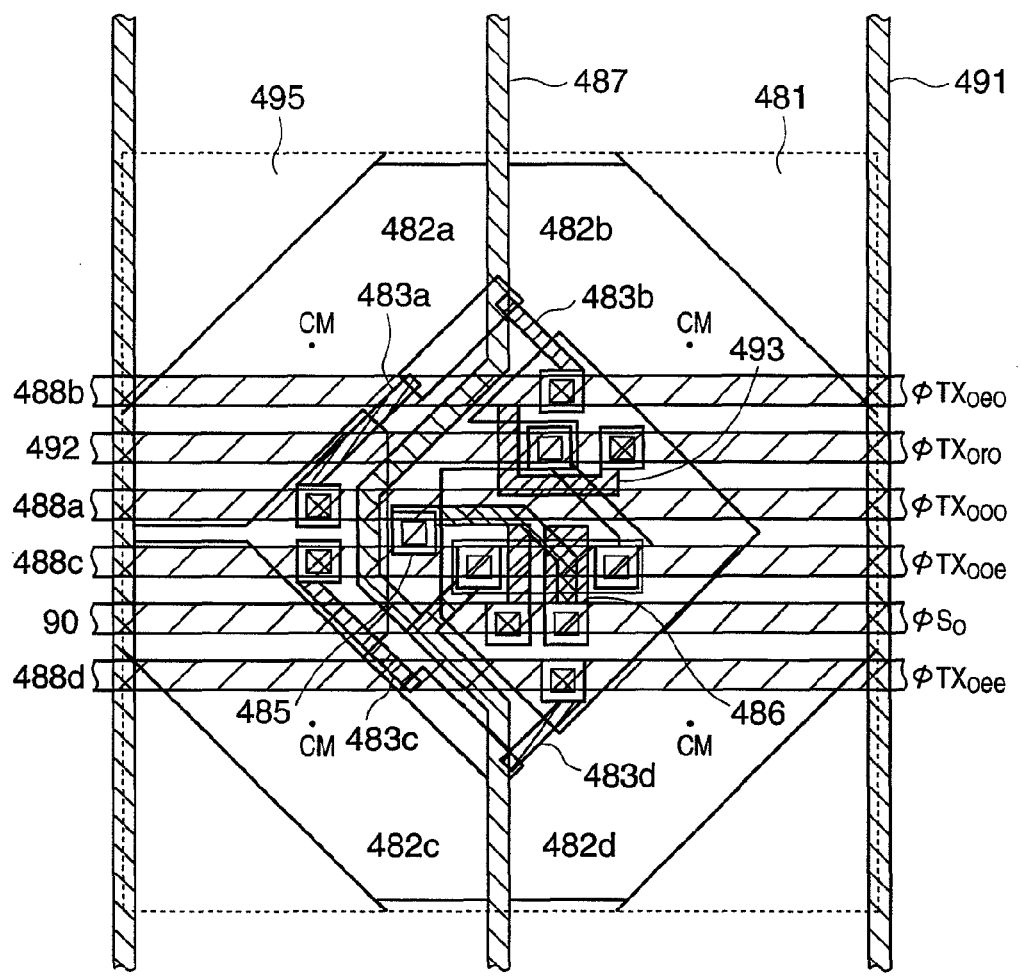
FIG. 23 is a practical pattern layout of four photodiodes and an amplifier according to the third embodiment of the present invention.
Figure 25:
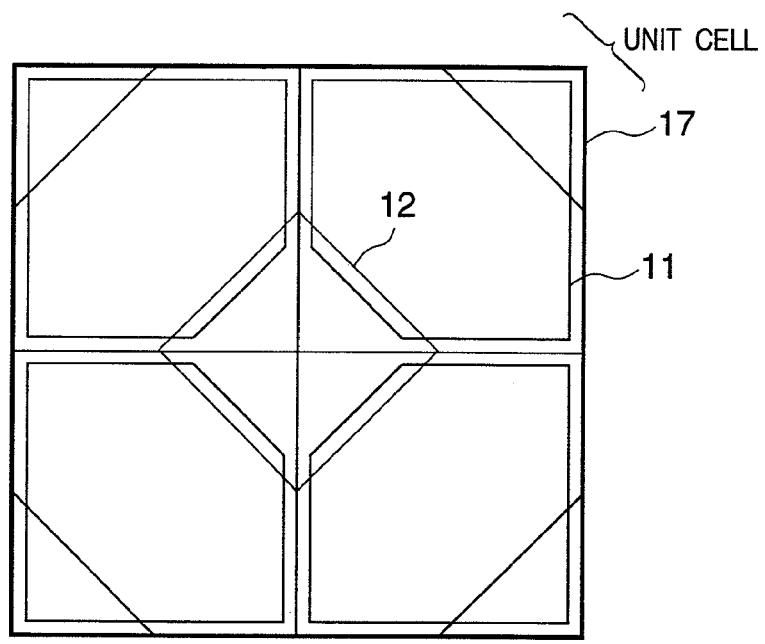
FIG. 25 is an explanatory view for explaining a variation of a layout.

FIG. 23 shows a practical pattern layout of four photodiodes and an amplifier in the CMOS sensor 22 in FIG. 1.

The CMOS sensor, as shown in FIG. 23, is formed on a single crystalline silicon substrate based on a layout rule 0.4 μm. Each pixel is a square, 8 μm each side, and a source follower amplifier, as the amplifier 12, is shared by four pixels arranged in a 2×2 array. Therefore, the size of a unit cell 481, shown by a dash line, is 16 μm×16 μm. A plurality of unit cells 481 are arranged in two dimensions.

Photodiodes 482a, 482b, 482c, and 482d are formed diagonally in each pixel, and the shapes of the photodiodes 482a to 482d are nearly symmetry with respect to the center of the unit cell 481 as well as symmetry with respect to vertical and horizontal lines passing over the center of the unit cell 481. Further, the center of mass (CM) of each photodiode is designed to be at the same position in each pixel. Further, reference numeral 495 denotes a light-shield unit.

Reference numeral 488a is a scanning line for controlling a transfer gate 483a; 490, a row selection line; and 492, a reset line for controlling a gate 493 of a MOS transistor.

Photo-charges accumulated in the photodiodes 482a to 482d are transferred to a floating diffusion (FD) portion 485 via transfer gates 483a to 483d, respectively. The size of the transfer gates 483a to 483d is L=0.4 μm, W=1.0 μm (L is a channel length and W is a channel width).

The FD portion 485 is connected to the gate 486 of a source follower via an aluminum (Al) wire having a width of 0.4 μm, and the photo-charge transferred to the FD portion 485 modulates the gate voltage of the gate 486. The size of the MOS transistor of the gate 486 is L=0.8 μm, W=1.0 μm, and the total capacitance of the FD portion 485 and the gate 486 is about 5 fF. Since Q=CV, the gate voltage of the gate 486 changes by 3.2 volts in response to the transference of $10^5$ electrons.

Current flowing in from a $V_{DD}$ terminal 491 is modulated by the MOS transistor of the gate 486, and transferred to a vertical signal line 487. Current flowing through the vertical signal line 487 is processed by a signal processing circuit (not shown) and formed into image information.

Thereafter, in order to set the potentials of the photodiodes 482a to 482d, the FD portion 485, and the gate 486 to the predetermined potential $V_{DD}$, the gate 486 of the MOS transistor connected to the reset line 482 is opened (at this time, the transfer gates 483a to 483d are also opened), thereby the photodiodes 482a to 482d, the FD portion 485, and the gate 486 are electrically connected to the $V_{DD}$ terminal 491.

Thereafter, the transfer gates 483a to 483d are closed, thereby the accumulation of photo-charges in the photodiodes 482a to 482d start again.

In layout 1, the lines 488a to 488d, 490 and 492, passing over the unit cell 481 in the horizontal direction, are all formed with indium tin oxide, transparent conductor, of 1500 Å thickness. Therefore, areas of the photodiodes 482a to 482d under the aforesaid lines can also receive light, and the center of mass of each photodiode matches the center of mass of light-receiving area of the photodiode.

According to the Layout 1 in the third embodiment, it is possible to provide a CMOS sensor with relatively high area ratio and high aperture ratio, in which photodiodes are arranged at an equal pitch.

[Layout 2]

FIG. 24 shows another practical pattern layout of four photodiodes and an amplifier in the CMOS sensor 22.

Referring to FIG. 24, reference numerals 502a to 502b denote the photodiodes; 503a to 503d, transfer gates; 505, an FD portion; 506, the gate of a source follower; 507, a vertical signal line; 508a to 508d, scanning lines; 510, a row selection line; and 512, a reset line for controlling the gate 513 of a MOS transistor.

In layout 2 of the third embodiment, since three lines out of lines 508a to 508d, 510, and 512 pass through the central portion of each pixel. Therefore, if these lines are metal wires which shield light incoming toward the photodiodes 502a to 502d, the center of mass of the light-receiving area of each photodiode does not shift, and remains at the center of each pixel.

In layout 2 of the third embodiment, opaque metal wires with small resistance are generally used, time constant of the lines in the horizontal direction is improved, and a high-speed image sensing apparatus is obtained.

In the aforesaid layout 1 and layout 2 of the third embodiment, the portion under the shield unit is not effectively used. It is possible to extend the area of a photodiode, as a photoelectric conversion element, under the light-shield unit, and make the extended area function as a charge accumulation unit.

[Layout 3]

Figure 26:
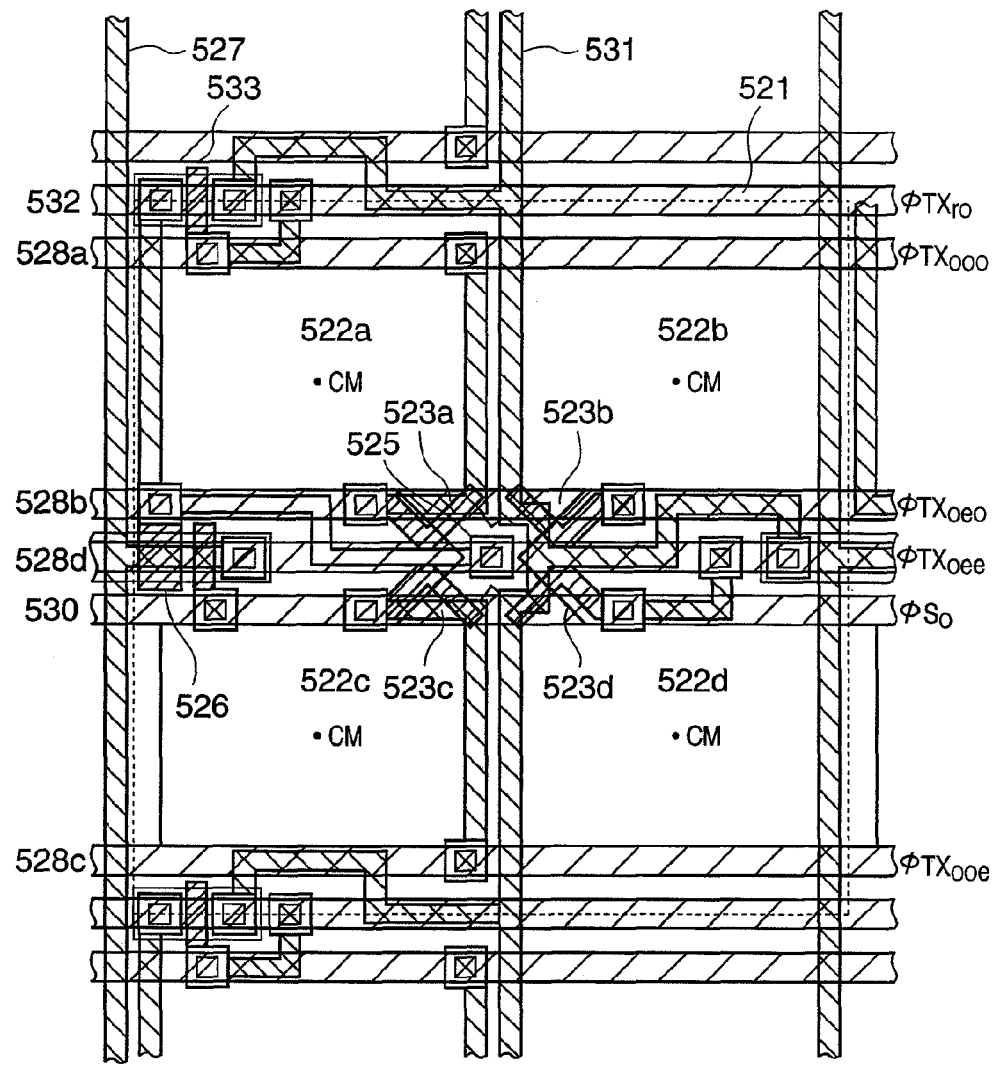
FIG. 26 shows a practical pattern layout according to the third embodiment of the present invention.

In layout 2 of the third embodiment, since the lines pass through the center of each pixel where light-receiving efficiency is high, sensitivity of the image sensing apparatus may not be good. Accordingly, an improved layout is shown in FIG. 26 as the layout 3 of the third embodiment. FIG. 26 is a practical pattern layout of the layout shown in FIG. 20.

In layout 3 of the third embodiment, transfer gates 523a to 523d, the gate 526 of a source follower, and the gate 533 of a MOS transistor for resetting are formed under scanning lines 528a to 528d, a row selection line 530, and a reset line 532; therefore, it is possible to maximize the size and aperture of each of photodiodes 522a to 522d. In addition, the aperture of each photodiode is at the center of each pixel. Further, light-shield units are formed in an area where horizontal and vertical wires are formed.

Further, in layout 3 of the third embodiment, the source follower, as the amplifier 12 shown in FIG. 20, and the MOS transistor for resetting are separately arranged in periphery of each photodiode in the row direction, thus, compactly arranged under wires running in the row direction.

Further, since there is a large area which is not yet used under wires in the upper right pixel, it is possible to add a new configuration, such as a smart sensor.

According to the layout 3 of the third embodiment, the area and aperture of a photodiode are increased comparing to the layout 2, it is possible to provide a high-sensitive image sensing apparatus with wide dynamic range. In addition, if the size of each pixel is further reduced and the size of the aperture of the photodiode becomes small, e.g., wavelength of light, each side, the problem such that light will not enter the photodiode will not arise. Thus, the layout 3 would remain as an efficient layout for the future.

Figure 27:
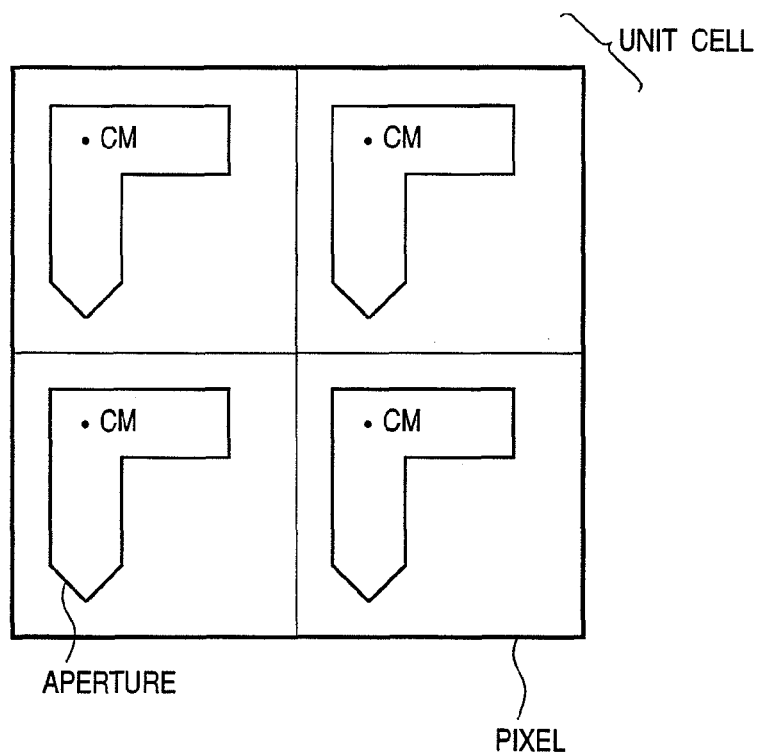
FIG. 27 shows another layout of light-receiving areas according to the third embodiment of the present invention.

In layout 3 of the third embodiment, the amplifier 12 is arranged at the central portion of each unit cell, and the center of mass of a light-receiving area is designed to match the center of mass of a pixel. However, the present invention is not limited to this, and the shape of apertures of pixels may be arbitrarily designed as long as the shape is identical and arranged in a fixed position in every pixel, as shown in FIG. 27, for instance.

In other words, by designing the apertures to have the same shape and arranged in a predetermined position in each pixel, intervals between the centers of mass of light receiving areas become the same.

[Layout 4]

Figure 28:
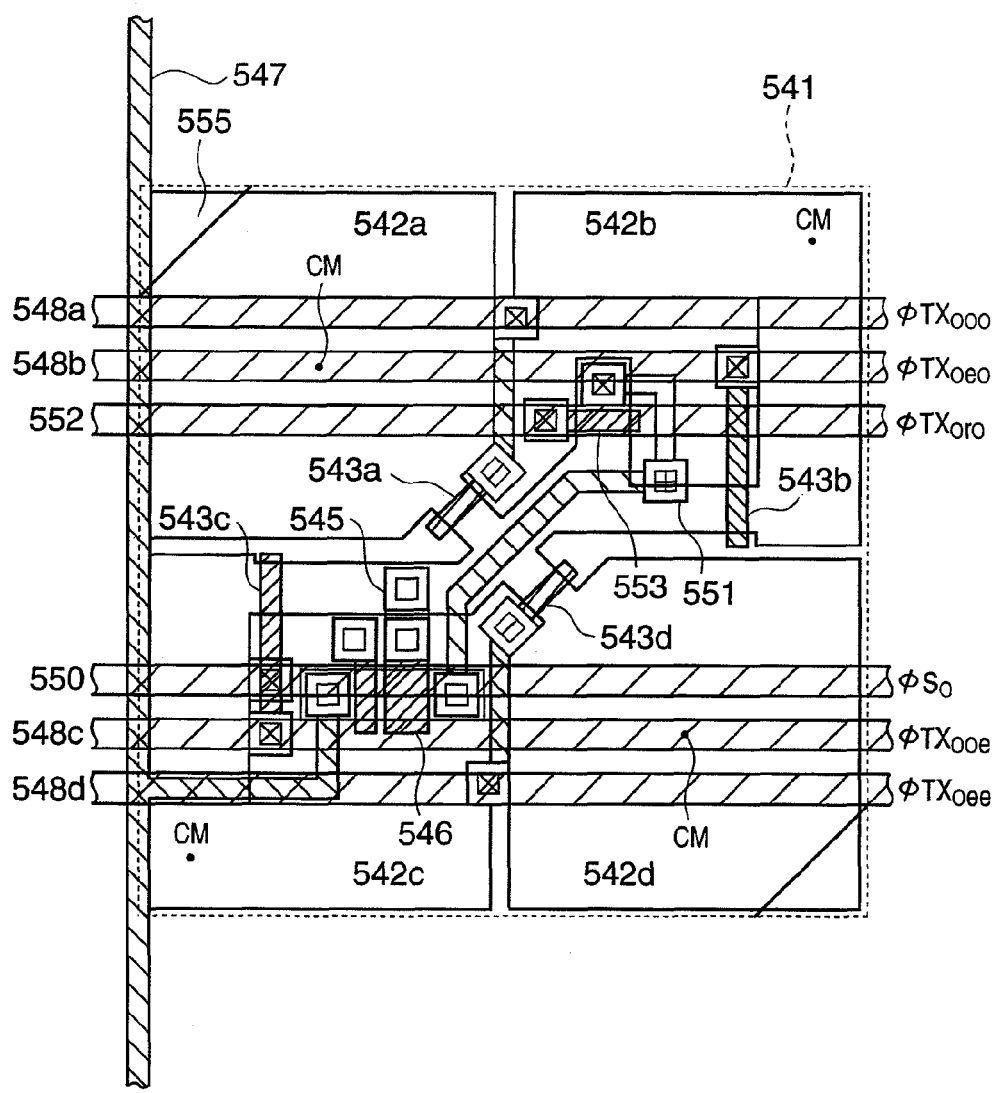
FIG. 28 shows another practical pattern layout of four photodiodes and an amplifier according to the third embodiment of the present invention.

FIG. 28 shows a practical pattern layout, corresponding to FIG. 21, of four photodiodes and an amplifier in the CMOS sensor 22 in FIG. 1.

In layout 4 of the third embodiment, colors of a color filter and positions of the colors are predetermined. Specifically, in the four pixels arranged in a 2×2 array, the upper left and lower right pixels are covered with green filter (G pixels) which contributes most to luminance signals, the upper right pixel is covered with red filter (R pixel), and the lower left pixel is covered with blue filter (B pixel).

In layout 4, the amplifier 12 and other peripheral circuits are arranged so that photodiodes 542a and 542d of the G pixels have the maximum area and aperture ratio.

Further, the center of mass of light-receiving area of a G pixel matches the center of mass of the G pixel, thus, the intervals between the centers of mass of G pixels are equal.

According to the layout 4 of the third embodiment, it is possible to provide a high sensitive image sensing apparatus.

[On-Chip Lens and Other Variations]

Figure 29:
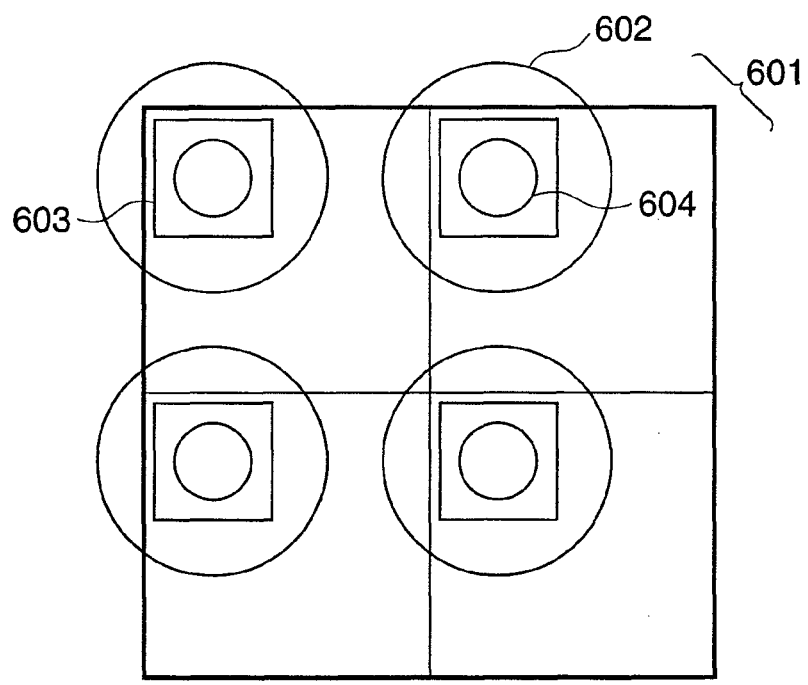
FIG. 29 is an example when on-chip lens according to the third embodiment of the present invention.

FIG. 29 shows an example when on-chip lens is used in the CMOS sensor 22 in FIG. 1.

Referring to FIG. 29, an on-chip lens 602 is formed on each pixel in a unit cell 601. Light incoming from outside of the CMOS sensor 22 is collected by the on-chip lens 602 and incidents on the aperture 603. Reference numeral 604 denotes an imaging area where light is gathered by the on-chip lens 602.

By controlling the design and the position of the on-chip lens, the position of the imaging area can be set relatively freely.

Thus, when a plurality of pixels share a single amplifier, if photodiodes, as photoelectric conversion elements, could not be arranged at a same interval, image signals as if they are obtained by photodiodes which are arranged at a same interval can be obtained by controlling the designs and positions of on-chip lenses.

Further, if an image sensing lens used in the image sensing apparatus is not telecentric, an incoming angle of light which incidents on a sensor chip in the central portion is different from an outer portion. Thus, by setting apertures of photodiodes in the outer portion of the CMOS sensor at different intervals, image signals as if they are obtained by photodiodes which are arranged at a same interval can be obtained.

According to the layout 1 to layout 4 of the third embodiment, light-shield units which are optical members are adjusted to make intervals between light-receiving areas identical. With the on-chip lens, the intervals of light receiving areas are made identical virtually by adjusting the designs and positions of the on-chip lenses, i.e., other optical members.

It should be noted that a configuration using an optical member, such as an on-chip lens, is also applicable to the first and second embodiments.

[Noise Reduction]

The inventors of the present application also have developed a signal read circuit for reducing noise suitably used in an image sensing apparatus having a configuration, as described above, in which a plurality of pixels share an amplifier.

Figure 30:
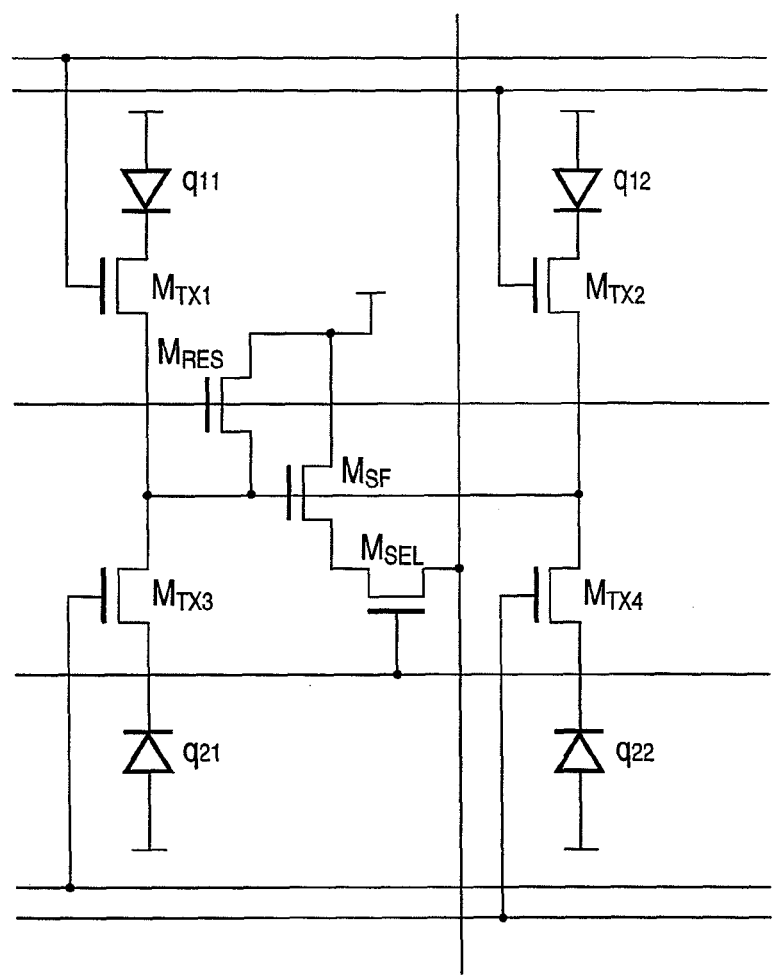
FIG. 30 is a circuit diagram of a unit cell of a CMOS sensor having the aforesaid configurations according to the third embodiment of the present invention.

FIG. 30 is a circuit diagram of a unit cell of the CMOS sensor having any of the aforesaid configurations.

Referring to FIG. 30, references $q_{11}$, $q_{12}$, $q_{21}$, and $q_{22}$ are photodiodes as photoelectric conversion elements; $M_{TX1}$ to $M_{TX4}$, MOS transistors for transferring photo-charges accumulated in the photodiodes $q_{11}$, $q_{12}$, $q_{21}$, and $q_{22}$ to a floating diffusion (FD) portion; a MOS transistor for resetting the FD portion; and $M_{SF}$ and $M_{SEL}$, MOS transistors configuring a source follower. The MOS transistor $M_{SEL}$ also functions as a selection switch for selecting a photodiode.

Figure 31:
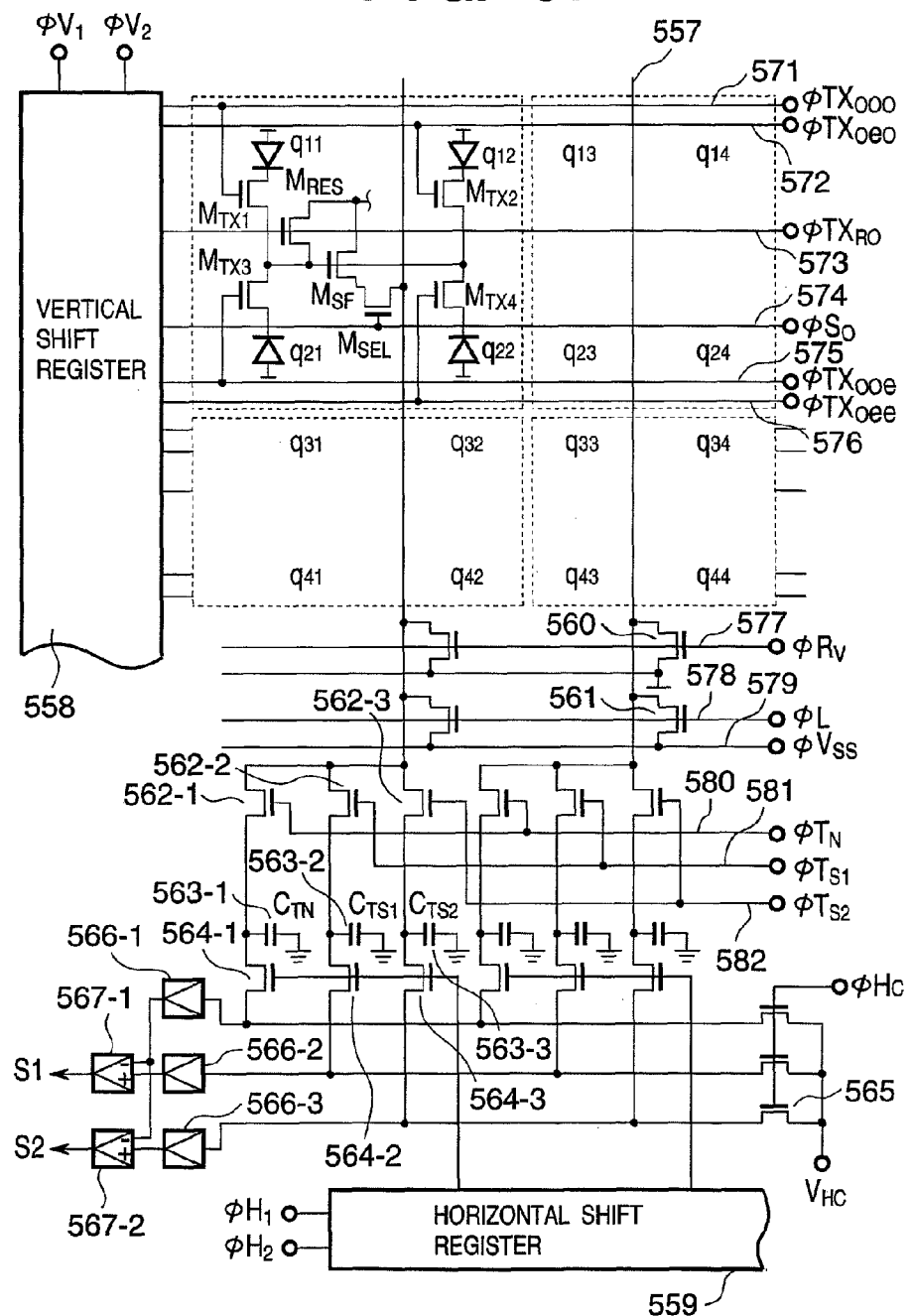
FIG. 31 is a circuit diagram of the image sensing apparatus including a signal processing unit according to the third embodiment of the present invention.

Next, an operation of the image sensing apparatus including a signal processing circuit according to the third embodiment is explained. FIG. 31 is an equivalent circuit of the image sensing apparatus including the signal processing unit.

Figure 32:
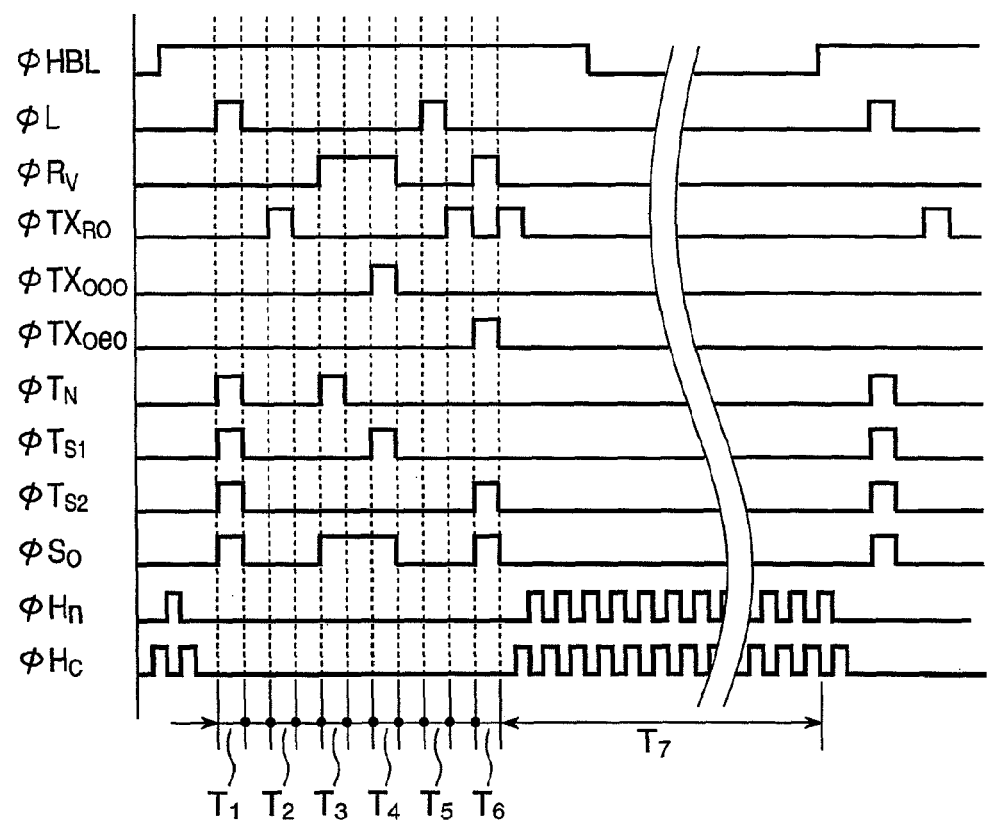
FIG. 32 is a timing chart for operating an image sensing apparatus according to the third embodiment of the present invention.

FIG. 32 is a timing chart for operating the image sensing apparatus shown in FIG. 31.

Referring to FIGS. 31 and 32, vertical scanning operation is initiated in response to the pulse, which indicates a vertical blanking period, of a signal $\phi V_1$ or $\phi V_2$. First, a signal $\phi TX_{RO}$ which is applied to a reset line 573 of the first row is activated during a horizontal blanking period (i.e., when a signal $\phi HBL$ is high), and signals for subsequent lines are applied in the same manner. Accordingly, all the pixels in every row are reset to the reset potential V.

In each horizontal blanking period, as shown in FIG. 32, during a period $T_{11}$, a signal $\phi L$ becomes high and a transistor 561, connected for a vertical signal line 557, is turned on and the vertical signal line 557 is reset. Simultaneously, signals $\phi T_N$, $\phi T_{S1}$ and $\phi T_{S2}$ also become high, and transistors 562-1 to 562-3 are turned on. Accordingly wires in the upstream of transistors for reading signal, 564-1 to 564-3, and capacitors 563-1 to 563-3 ($C_{TN}$, $C_{TS1}$, $C_{TS2}$) are electrically connected to the vertical signal line 557, and reset. Accordingly, residual charges in the capacitors 563-1 to 563-3, for instance, are removed.

Thereafter, in a period $T_{12}$, a signal $\phi TX_{RO}$ to be applied to the reset line 573 is changed to high, and the floating gate, which is the gate of the source follower amplifier configured with the MOS transistors $M_{SF}$ and $M_{SEL}$ in each unit cell, is reset to the voltage $V_{DD}$.

Then, in a period $T_{13}$, a signal $\phi RV$ becomes high and a transistor 560 for grounding, connected to the vertical signal line 557, is turned on, and the vertical signal line 557 is grounded. Simultaneously, the signal $\phi T_N$ is changed to high in order to connect the capacitor 563-1 ($C_{TN}$) for storing a noise component to the vertical signal line 557, and the transistor 562-1 is turned on. At this time, a signal $\phi S_O$ to be applied to a row selection line 574 is high, and current corresponding to the potential (about $V_{DD}$) at the floating gate of the MOS transistor $M_{SF}$ flows from a $V_{DD}$ terminal to the capacitor 563-1 ($C_{TN}$), thereby the capacitor 563-1 ($C_{TN}$) stores charge corresponding to the noise component.

Next, in a period $T_{14}$, a signal $\phi TX_{OOO}$ applied to the odd-column scanning line 571 is changed to high, in turn, a transfer gate (MOS transistor $M_{TX1}$, in this case) for an odd-number column in an odd-number row is turned on, and photo-charge accumulated in the photodiode $q_{11}$ is transferred to the floating gate of the MOS transistor $M_{SF}$. The capacitor 563-1 ($C_{TN}$) for storing the noise component is disconnected from the vertical signal line 557 when the signal $\phi T_N$ becomes low, and the capacitor 563-2 ($C_{TS1}$) for storing a photo-charge signal is connected, in turn, when the signal $\phi T_{S1}$ is changed to high. Thus, charge accumulated in the photodiode $q_{11}$, for instance, in an odd-number column in an odd-number row is stored in the capacitor 563-2 ($C_{TS1}$) via the vertical signal line 557.

Next, in a period $T_{15}$, the signal $\phi L$ becomes high, and only the vertical signal line 557 is reset. Since the signals $\phi S_O$, $\phi T_N$, $\phi T_{S1}$, and $\phi T_{S2}$, are low, other portions are not reset, and their states are preserved.

Next, the signal $\phi TX_{RO}$ applied to the reset line 573 is changed to high between periods $T_{15}$ and $T_{16}$, and the gate of the source follower amplifier (i.e., the gate of MOS transistor $M_{SF}$) is reset to the potential $V_{DD}$.

In the period $T_{16}$, a signal $\phi TX_{OeO}$ applied to a scanning line 572 is changed to high, and photo-charge accumulated in the photodiode $q_{12}$ in an even-number column in an odd-number row is transferred to the floating gate of the MOS transistor $M_{SF}$. At this time, the signal $\phi T_{S2}$ is changed to high, and photo-charge accumulated in the photodiode $p_{12}$ is stored in the capacitor 563-3 ($C_{TS2}$) via the vertical signal line 557, in the similar manner.

In the aforesaid manner, charges corresponding to the noise component, a first signal, and a second signal are respectively stored in the capacitors 563-1, 563-2, and 563-3 ($C_{TN}$, $C_{TS1}$, $C_{TS2}$) by each column for a row.

Next, in a period $T_{17}$, in order to sequentially transfer the charges stored in the capacitors 563-1 to 563-3 ($C_{TN}$, $C_{TS1}$, $C_{TS2}$) to amplifiers 566-1 to 566-3, respectively, a horizontal scanning signal $\phi Hn$ is changed to high for each columns controlled by a horizontal shift register 559, and transistors 564-1 to 564-3, provided for each column, are turned on; thereby the capacitors 563-1 to 563-3 ($C_{TN}$, $C_{TS1}$, $C_{TS2}$) are connected to the respective amplifiers 566-1 to 566-3. From the capacitors 563-1 to 563-3 ($C_{TN}$, $C_{TS1}$, $C_{TS2}$), the noise component, the first signal, and the second signal are outputted, and from a differential amplifier 567-1, a signal S1 obtained by subtracting the noise component from the first signal is outputted, and a signal S2 obtained by subtracting the noise component from the second signal is outputted from a differential amplifier 567-2. Note that accumulation of photo-charges by the photodiodes are also performed during the period $T_{17}$.

Further, by changing signals $\phi TX_{OOe}$ and $\phi TX_{Oee}$ to high instead of the signals $\phi TX_{OOO}$ and $\phi TX_{OeO}$ in the aforesaid operation, signals corresponding to photo-charges accumulated in the photodiodes $q_{21}$ and $q_{22}$ in an even-number row are read out and a noise component is subtracted from those photo-charge signals to obtain the signals S1 and S2.

First Modification of the Third Embodiment

Next, another configuration of an image sensing apparatus including a signal processing circuit is explained.

Figure 33:
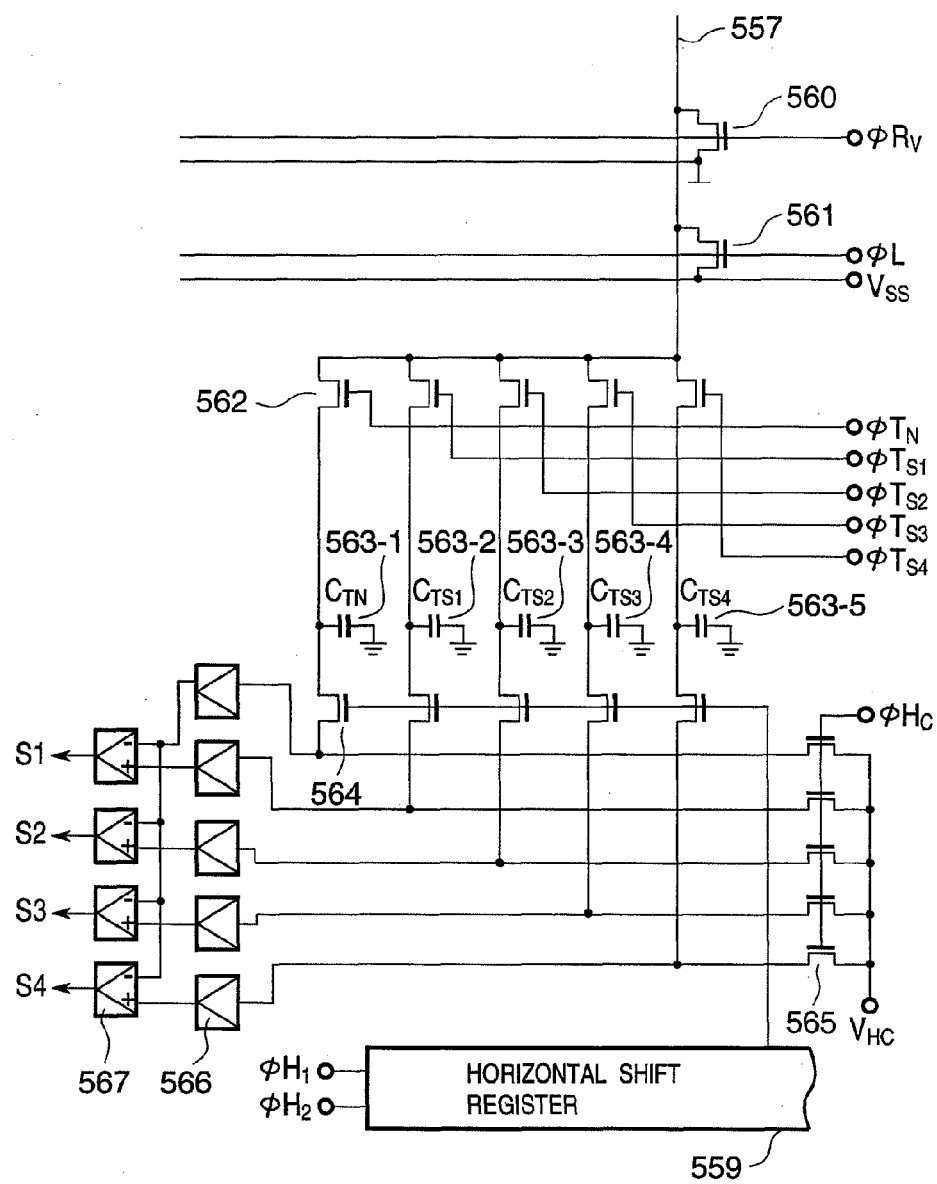
FIG. 33 is a circuit diagram of an image sensing apparatus including the signal processing unit according to a first modification of the third embodiment of the present invention.

FIG. 33 is an equivalent circuit of the image sensing apparatus including the signal processing unit.

In the modification 1, four capacitors 563-2 to 563-5 ($C_{TS1}$ to $C_{TS4}$) are provided for storing photo-charge signals, and different information can be stored in the respective capacitors 563-2 to 563-5. More specifically, a signal corresponding to photo-charge accumulated in the photodiode $q_{11}$ is stored in the capacitor 563-2 ($C_{TS1}$), and a signal corresponding to photo-charge accumulated in the photodiode $q_{22}$ is stored in the capacitor 563-5 ($C_{TS4}$) for instance. Therefore, processes performed in the downstream of amplifiers 566 may be operated at a half clock speed to achieve the same throughput of the image sensing apparatus having the configuration shown in FIG. 31. Accordingly, the amplifiers 566, the differential amplifiers 567, and other signal processing circuits may be also operated at a half clock speed comparing to the configuration shown in FIG. 31. Thus, required speed of the operating elements is decreased, and it is possible to use inexpensive lower performance elements to configure the circuit. As a result, the cost of the system is reduced.

Note, the charges to be stored in the capacitors are not limited to those respectively corresponding to photo-charges accumulated in the respective photodiodes, and added charges may be stored by controlling operation of the transfer gates and the reset MOS. When the CMOS sensor 22 has the configuration as shown in FIG. 21, for instance, it is possible to store a photo-charge signal of the G photodiode $q_{11}$ in the capacitor 563-2 ($C_{TS1}$) a photo-charge signal of the G photodiode $q_{22}$ in the capacitor 563-3 ($C_{TS2}$), and a photo-charge signal of the R photodiode $q_{12}$ and the B photodiode $q_{21}$ in the capacitor 563-4 ($C_{TS3}$). It is effective to apply this configuration to a smart sensor using each pixel more intelligently.

According to the configuration as explained in the third embodiment and the first modification of the third embodiment, it is possible to reduce noise caused by variation in characteristics of amplifiers each provided for each unit cell.

Second Modification of the Third Embodiment

Figure 34:
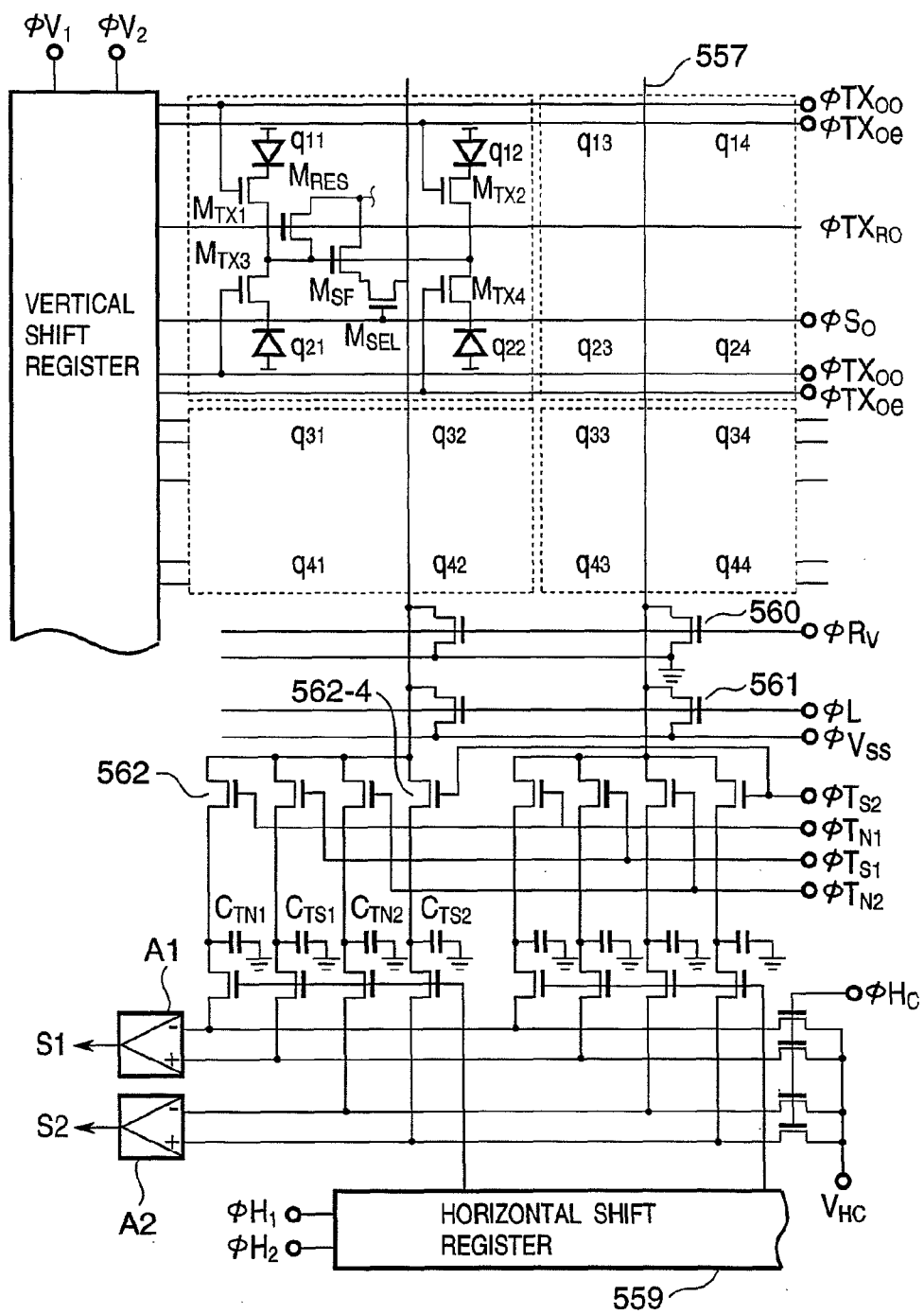
FIG. 34 is a circuit diagram of an image sensing apparatus including a signal processing unit according to a second modification of the third embodiment of the present invention.
Figure 35:
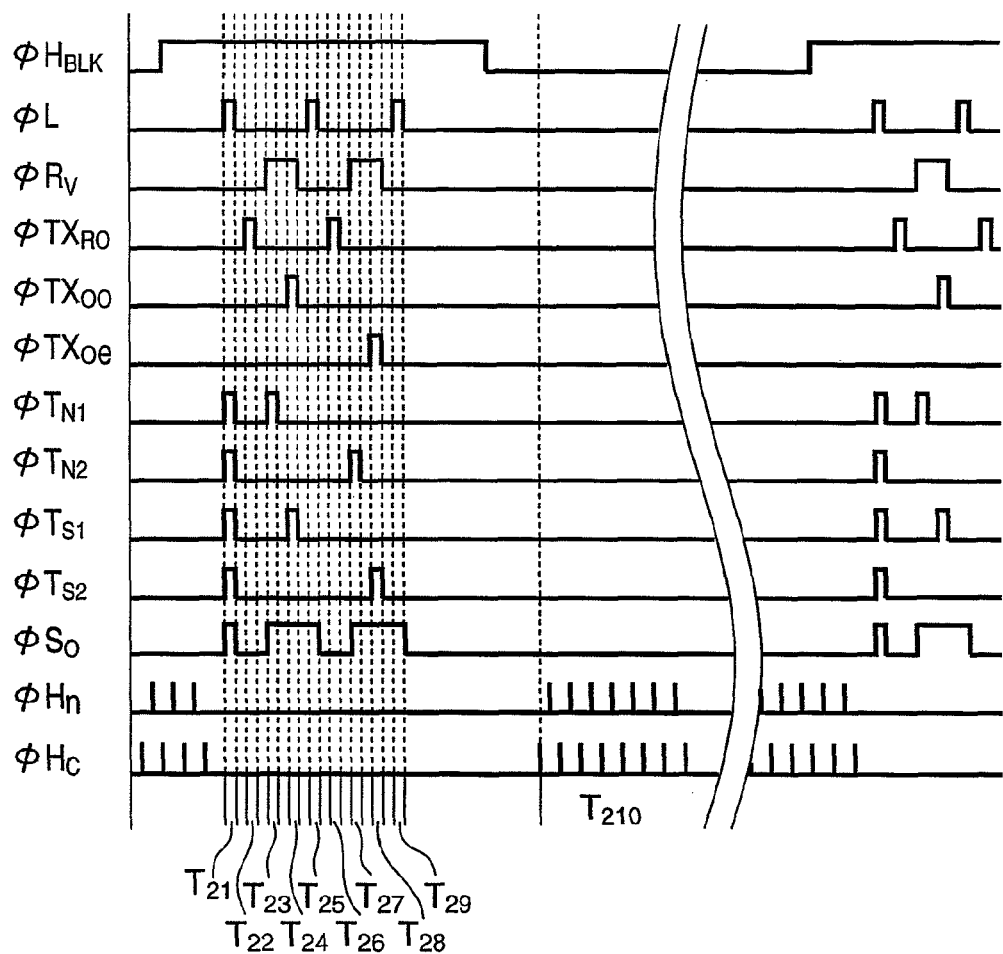
FIG. 35 is a timing chart for operating the image sensing apparatus shown in FIG. 34 according to the second modification of the third embodiment of the present invention.

Next, a case of operating the image sensing apparatus of the second modification of the third embodiment will be explained with reference to FIGS. 34 and 35. FIG. 34 is an equivalent circuit of an image sensing apparatus including a signal processing circuit, and FIG. 35 is a timing chart for operating the image sensing apparatus shown in FIG. 34.

First, during a horizontal blanking period, photo-charges accumulated in pixels are transferred and photodiodes are reset to an initial state.

During a period $T_{21}$, the vertical signal lines 557 are reset by changing a signal $\phi R_v$ to high to remove residual charges on the vertical signal lines 557. At the same time, residual charges in the capacitors $C_{TN1}$, $C_{TN2}$, $C_{TS1}$, $C_{TS2}$ are removed by changing signals $\phi T_{N1}$, $\phi T_{N2}$, $\phi T_{S1}$, and $\phi T_{S2}$ to high.

During a period $T_{22}$, in advance of transferring photo-charges of photodiodes in odd-number columns in a first row ($q_{11}, q_{13}, \ldots q_{1(n-1)}$), the gates of amplifiers (the gates of the MOS amplifiers $M_{SF}$) are reset by changing a signal $\phi TX_{RO}$ to high and residual charges in the gates are removed. After resetting the gates, reset noise remains.

During a period $T_{23}$, the reset noise from the period $T_{22}$ and offset voltages of the amplifiers are transferred to capacitors $C_{TN1}$. The output terminals of the amplifiers are electrically connected to the vertical signal lines 557 by changing a signal $\phi S_O$ to high, and a signal $\phi L$ is also changed to high to turn on MOS transistors 561 for activating the amplifiers. Further, a signal $T_{N1}$ is changed to high to electrically connect the capacitors $C_{TN1}$ with the respective vertical signal lines 557. Accordingly, noise is stored in the capacitors $C_{TN1}$.

During a period $T_{24}$, photo-charges of photodiodes in odd-number columns in a first row ($q_{11}, q_{13}, \ldots, q_{1(n-1)}$) are transferred to the capacitors $C_{TS1}$. By changing the signals $\phi L$, $\phi T_{S1}$, and $\phi S_O$ to high, the amplifiers and the capacitors $C_{TS1}$ are electrically connected.

When a signal $\phi TX_{OO}$ becomes high, photo-charge is transferred from each photodiode in the odd-number column in the first row to the amplifier. With this operation, the photo-charge is added to the reset noise from the period $T_{22}$ at the gate of the amplifier. This gate voltage is further superposed on the offset voltage, and a signal (S1+N1) is stored in each capacitor $C_{TS1}$.

During the periods $T_{25}$ to $T_{28}$, photo-charges of photodiodes in even-number columns in the first row ($q_{12}, q_{14}, \ldots, q_{1n}$) are transferred to the capacitors $C_{TS2}$. The basic operation is the same as that performed during the periods $T_{21}$ to $T_{24}$, except a signal $\phi TX_{Oe}$ is changed to high instead of the signal $\phi TX_{OO}$, a signal $\phi T_{N2}$ is changed to high instead of the signal $\phi T_{N1}$, and a signal $\phi T_{S2}$ is changed to high instead of the signal $\phi T_{S1}$.

During a period $T_{29}$, residual charges in the vertical signal lines 557, the amplifiers, and the transfer MOS are removed, thereby transference of reset noise and photo-charge signals are completed.

After the aforesaid processes, noise signals N1 and N2, and signals (S1+N1) and (S2+N2) are stored in the capacitors $C_{TN1}$, $C_{TN2}$, $C_{TS1}$, and $C_{TS2}$, respectively. These signals are outputted via horizontal signal lines in response to signals $\phi H1$ and $\phi H2$ controlled by a horizontal shift register 559 during a period $T_{210}$. Then, in a differential amplifier A1, the noise signal N1 is subtracted from the signal (S1+N1), thereby a signal S1 is outputted, and in a differential amplifier A2, the noise signal N2 is subtracted from the photo-charge signal (S2+N2), thereby a signal S2 is outputted.

Accordingly, photo-charge signals faithfully corresponding to the photo-charges accumulated in the photodiodes $q_{11}$ to $q_{1n}$ in the first row are obtained. Charging operation starts when photo-charges are transferred to the gate in the period $T_{24}$ and $T_{28}$.

In the next horizontal blanking period, the same operation performed for the first row as described above is repeated for the second row. After reading out the photo-charges of photodiodes in the second row, the amplifier, shared by four pixels, are put into a disconnected state until the next vertical blanking period when next operation is performed.

In order to read out photo-charges by two rows, another set of capacitors $C_{TN1}$, $C_{TS1}$ and $C_{TS2}$, and differential amplifiers A1 and A2 are to be added to the configuration shown in FIG. 34. More specifically, in the aforesaid operation, photo-charges are read out by a single row in a non-interlace operation, whereas photo-charges of two rows are read out in one horizontal period.

Figure 36:
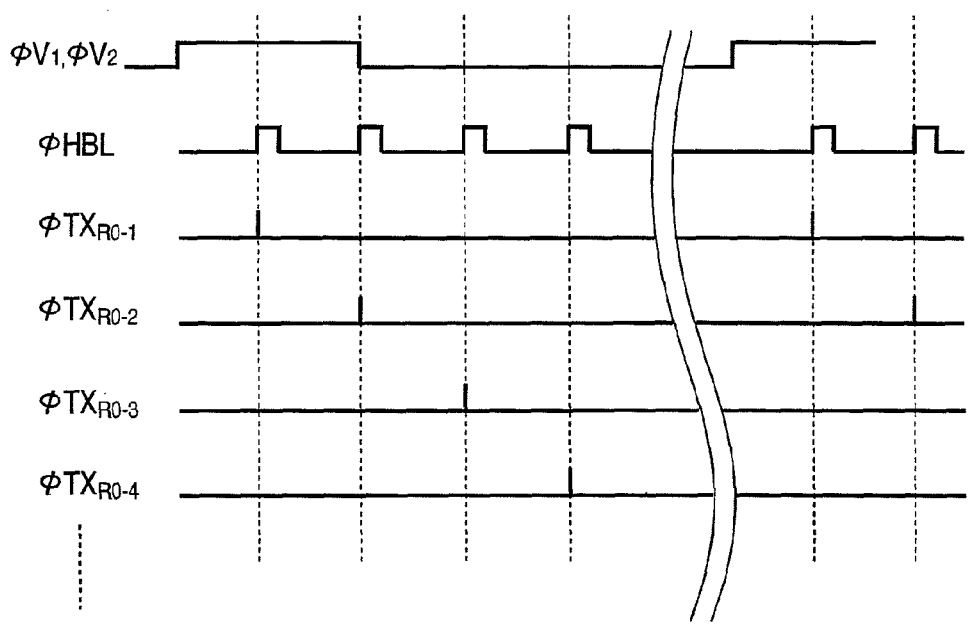
FIG. 36 is a timing chart during a vertical blanking period according to the second configuration of the third embodiment of the present invention.

FIG. 36 is a timing chart during a vertical blanking period.

While a single vertical blanking period, the aforesaid operation performed during the horizontal blanking period is repeated number-of-row times. The vertical shift register outputs operation pulses $\phi TX_{OO}$, $\phi TX_{Oe}$, $\phi TX_{RO}$, and $\phi S_O$ for each horizontal blanking period for each row.

As described above, in the second modification of the third embodiment, in addition to removing noise due to variation in characteristics of amplifiers as described in the third embodiment and in the first modification of the third embodiment, reset noise is also removed.

Fourth Embodiment

Next, the fourth embodiment of the present invention will be explained.

In the fourth embodiment, a case where an additional function is added to an amplifier, a common circuit in the aforesaid embodiments, shared in a unit cell is explained.

Figure 37:
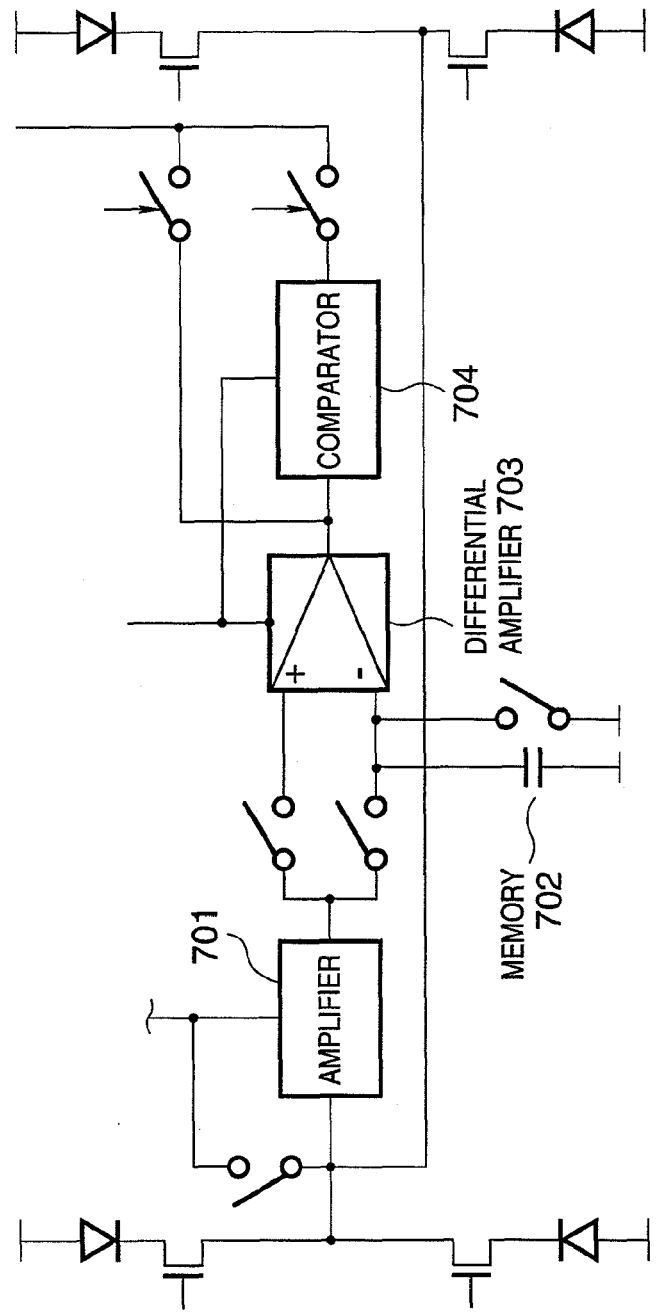
FIG. 37 shows a configuration of a common circuit according to a fourth embodiment of the present invention.

FIG. 37 shows a configuration of the common circuit with the additional function.

In the downstream of an amplifier 701, memory 702, a differential amplifier 703, and a comparator 704 are added. The noise, as described in the foregoing embodiments, is temporarily stored in the memory 702, a signal (S-N) is transferred to the positive terminal of the differential amplifier 703, and the differential amplifier 703 takes the difference between the noise and the signal (S-N), thereby, a signal S, including no noise component, is obtained. The signal is transferred to a vertical signal line. Or, depending upon utilization purpose of the signal, the obtained signal can be digitized by the comparator 704.

Further, by replacing the comparator 704 with an analog-digital (A/D) converter, a digital signal can be obtained. The digital signal output from the A/D converter may be either a serial signal or a parallel signal. The circuit may be arbitrary changed depending upon utilization purpose.

Other Embodiments

Figure 38:
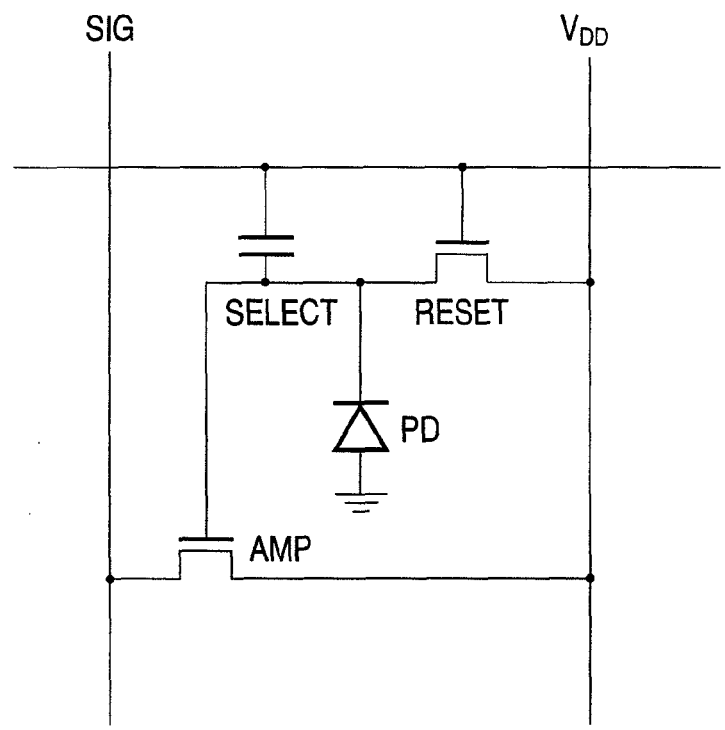
FIG. 38 is a circuit diagram of a unit cell of another image sensor to which the present invention is applied.
Figure 41:
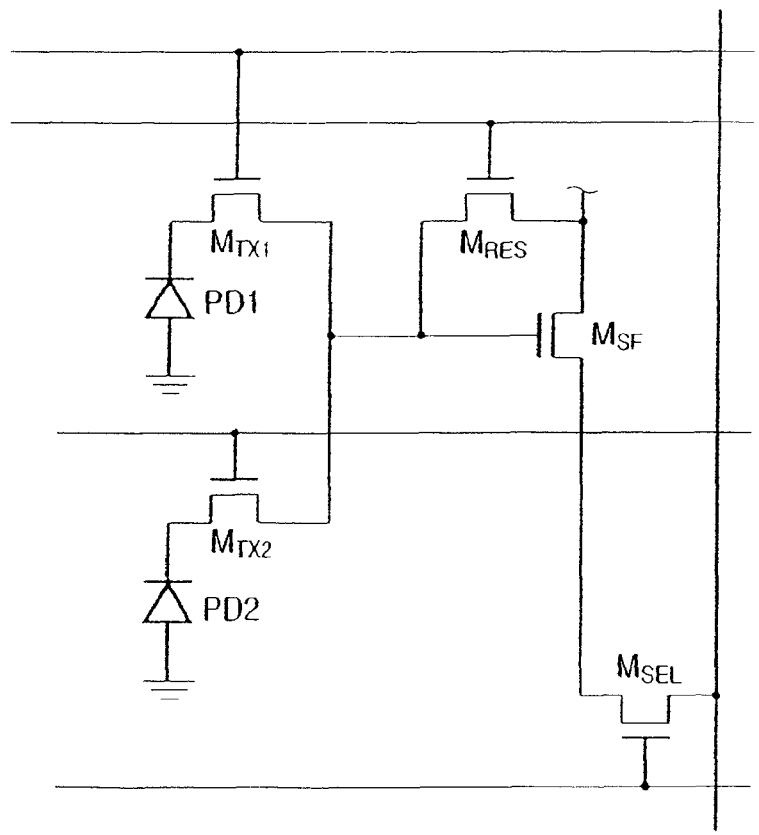
FIG. 41 is a circuit diagram of a conventional configuration.
Figure 42:
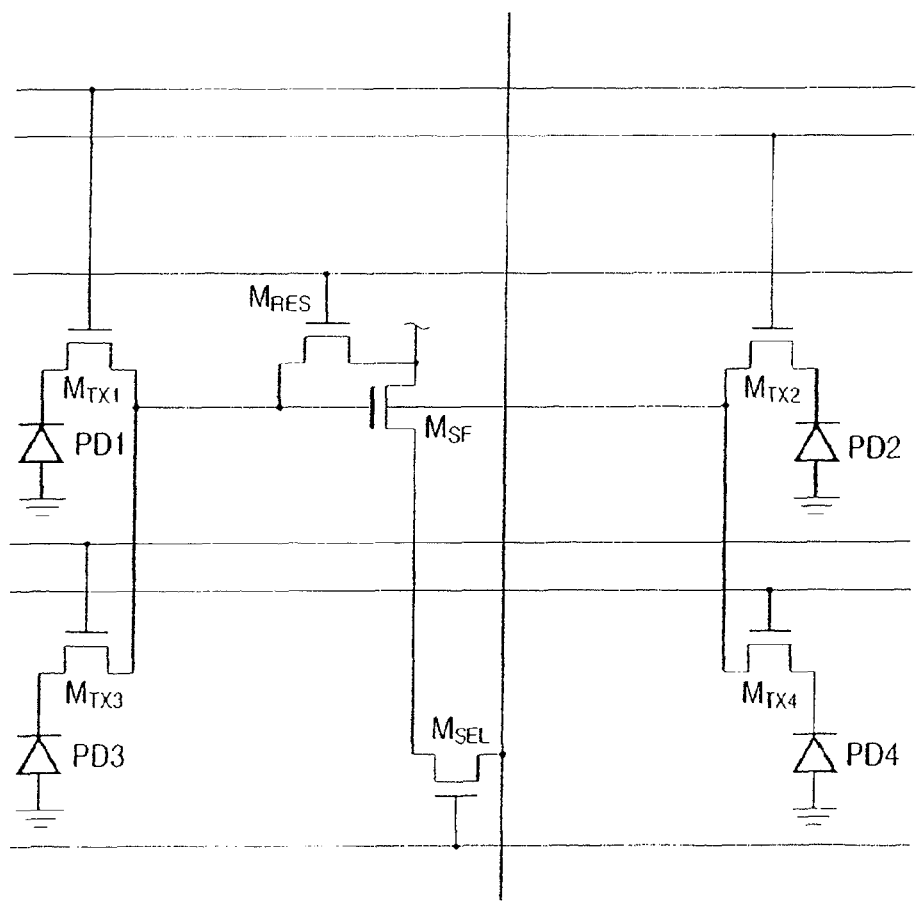
FIG. 42 is a circuit diagram of another conventional configuration.

The present invention is not limited to a general CMOS sensor as shown in FIG. 41 or 42, and may be applied to an image sensor as disclosed in ISSCC98/SESS:ON11/IMAGESENSORS/PAPER FA11.8pp182, shown in FIG. 38.

Figure 39:
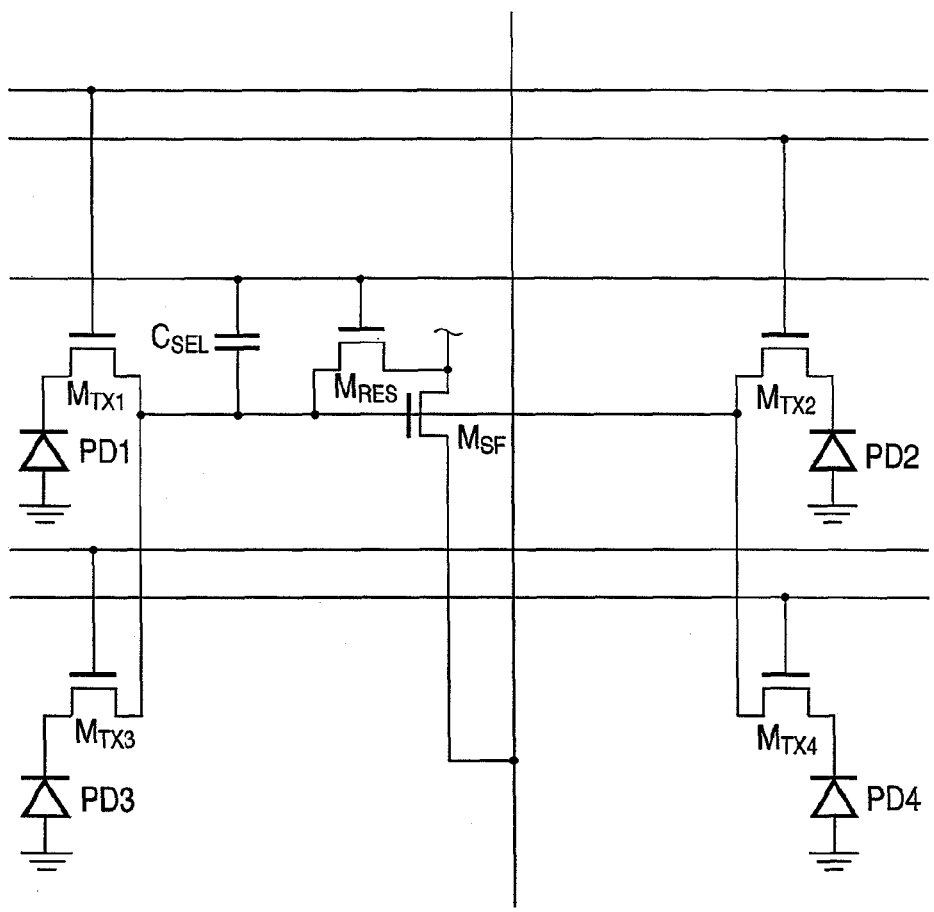
FIG. 39 is a circuit diagram of a configuration of an amplifier shared by four photodiodes according to an embodiment of the present invention.
Figure 40:
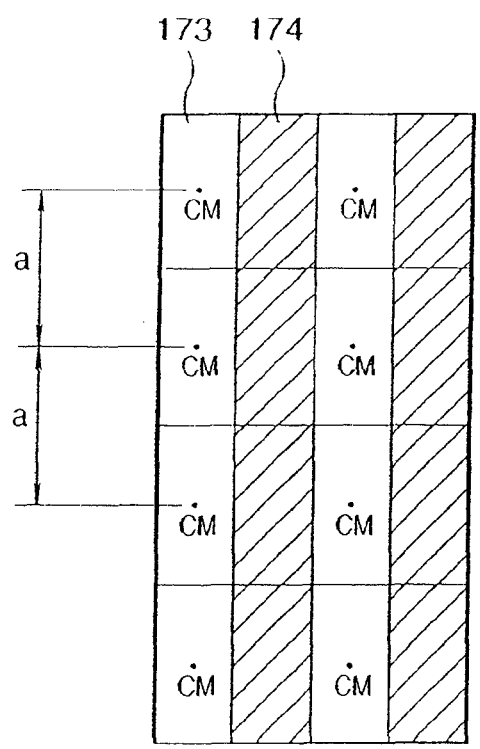
FIG. 40 shows a conventional layout of amplifiers in pixels.

In this case, a configuration of an amplifier shared by e.g., four photodiodes, may be the one as shown in FIG. 39.

Further, the present invention is not limited to a CMOS sensor, and applicable to any APS sensors.

Furthermore, in the first to fourth embodiments, a plurality of photoelectric conversion elements are arranged to share a single amplifier, forming a unit cell altogether, however, the amplifier may be replaced by other unit which processes signals, outputted from a plurality of photoelectric conversion elements. For instance, an A/D conversion circuit (U.S. Pat. No. 5,461,425) and a signal processing circuit, e.g., an image compressor (Journal of Television Society vol. 150, no. 3, pp. 335 to 338, 1995) may be used in place of the amplifier.

The present invention is not limited to the above embodiments and various changes and modifications can be made within the spirit and scope of the present invention. Therefore to apprise the public of the scope of the present invention, the following claims are made.

What is claimed is:

1. An image sensing apparatus having a plurality of unit cells arranged in two dimensions, each unit cell including a plurality of photoelectric conversion elements, a common amplifier element shared by the plurality of photoelectric conversion elements, a reset element for resetting a potential of an input portion of the common amplifier element, and a plurality of transfer elements arranged respectively with the plurality of photoelectric conversion elements for transferring charge generated by each photoelectric conversion element to the input portion of the common amplifier element, wherein the common amplifier element and the reset element are arranged on the opposite sides of each photoelectric conversion element, and each photoelectric conversion element is arranged on a line along a first direction between the common amplifier element and the reset element, wherein intervals between centers of mass of photo-receiving areas of photoelectric conversion elements immediately adjoining to each other in the first direction, are substantially equal in distance within and between all of the plurality of unit cells, and wherein the common amplifier element and the reset element are not arranged in an area between photoelectric conversion elements adjacent each other in the first direction.

2. The apparatus according to claim 1, wherein driving signal lines for driving the plurality of transfer elements are arranged on opposed sides of a row of the photoelectric conversion elements in each cell.

3. The apparatus according to claim 1, wherein the intervals between the centers of mass of the photo-receiving areas of photoelectric conversion elements, immediately adjoining to each other in a second direction which is different from the first direction, are substantially equal in distance.

4. The apparatus according to claim 1, further comprising:
noise reading means for reading a noise of the common amplifier element;
first signal reading means for reading a first signal through the common amplifier element;
second signal reading means for reading a second signal through the common amplifier element; and
noise reduction means for reducing the noise from the first and second signals.

5. The apparatus according to claim 4, wherein the first signal is read from one of the plurality of photoelectric conversion elements in each unit cell, and the second signal is read from another photoelectric conversion element in the same unit cell.

6. An image sensing system having the image sensing apparatus according to claim 1, a lens system for forming an image on the image sensing apparatus, and a signal processing circuit for processing an output signal from the image sensing apparatus.

* * * * *